United States Patent [19]

Kizuki et al.

[11] Patent Number: 5,541,950

[45] Date of Patent: Jul. 30, 1996

[54] SEMICONDUCTOR LASER INCLUDING GROOVE HAVING VARIABLE DIMENSIONS

[75] Inventors: Hirotaka Kizuki; Shoichi Karakida, both of Itami, Japan

[73] Assignee: Mitsubishi Denki Kabushiki Kaisha, Tokyo, Japan

[21] Appl. No.: 392,268

[22] Filed: Feb. 22, 1995

[30] Foreign Application Priority Data

Feb. 22, 1994 [JP] Japan .................................. 6-022958

[51] Int. Cl.$^6$ ....................................................... H01S 3/18
[52] U.S. Cl. ................................................. 372/46; 372/44
[58] Field of Search ............................... 372/43, 45, 46, 372/44

[56] References Cited

U.S. PATENT DOCUMENTS

| | | | |
|---|---|---|---|
| 4,791,635 | 12/1988 | Schairer et al. | 372/46 |
| 5,023,199 | 6/1991 | Murakami et al. | 437/167 |
| 5,185,755 | 2/1993 | Mori et al. | 372/46 |
| 5,336,635 | 9/1994 | Anayama et al. | 437/129 |

FOREIGN PATENT DOCUMENTS

| | | | |
|---|---|---|---|
| 95895 | 5/1983 | European Pat. Off. | |
| 155853 | 3/1985 | European Pat. Off. | |
| 57-49298 | 3/1982 | Japan | 372/46 |
| 59-63788 | 4/1984 | Japan | 372/43 |
| 63-308989 | 12/1988 | Japan | 372/43 |
| 2221093 | 7/1989 | United Kingdom | |

OTHER PUBLICATIONS

Sasaki et al, "Highly Reliable 150 mW CW Operation Of Single–Stripe AlGaAs Lasers With Window Grown On Facets", Japanese Journal of Applied Physics, vol. 30, No. 5B, May 1991, pp. L–906–L–906.

"Laser Diode Technology and Application III", SPIE—The International Society for Optical Engineering, Jan. 1991, pp. 363–371.

Daniel Renner, "Laser Diode Technology and Applications IV", SPIE—The International Society for Optical Engineering, vol. 1634, Jan. 1992, pp. 319–328.

*Primary Examiner*—Rodney B. Bovernick
*Assistant Examiner*—Robert McNutt
*Attorney, Agent, or Firm*—Leydig, Voit & Mayer

[57] ABSTRACT

A semiconductor laser including a semiconductor substrate of a first conductivity type; a semiconductor multilayer structure disposed on the substrate and including a first cladding layer of the first conductivity type, an active layer, a second cladding layer of a second conductivity type, opposite the first conductivity type, and a current blocking layer of the first conductivity type; a laser light emitting facet; a stripe-shaped V groove extending in a resonator length direction transverse to the laser light emitting facet and penetrating in a depth direction into a part of the semiconductor multilayer structure, including into the second cladding layer, the stripe-shaped V groove having a width transverse to the resonator length direction and the depth direction wherein at least one of the depth and width of the stripe-shaped V groove has a first dimension adjacent the laser light emitting facet and a second dimension, different from the first dimension, within the semiconductor laser spaced from the laser light emitting facet; and a semiconductor layer of the second conductivity type disposed in and filling the stripe-shaped V groove.

5 Claims, 23 Drawing Sheets

Prior Art

SEMICONDUCTOR LASER INCLUDING GROOVE HAVING VARIABLE DIMENSIONS

FIELD OF THE INVENTION

The present invention relates to a semiconductor laser with a narrow stripe in an active region and a relatively simple method of fabricating the laser with high reproducibility.

BACKGROUND OF THE INVENTION

Recently, semiconductor laser diode arrays have been increasingly developed for applications in high-speed optical disk devices or for connections between computers. The following characteristics are required of the semiconductor laser diode arrays: uniform characteristics of individual laser elements, high reliability, and simple fabrication process ensuring good yield. However, since the existing laser diode arrays mostly have a structure in which discrete laser diodes are arranged in parallel on a substrate or the like, the above-described requirements are not satisfied yet.

FIG. 24 is a perspective view illustrating a typical optical disk semiconductor laser. In the figure, reference numeral 201 designates an n type GaAs substrate having opposite front and rear surfaces. An n type AlGaAs first cladding layer 202 is disposed on the front surface of the GaAs substrate 201. An active layer 203 is disposed on the first cladding layer 202. A p type AlGaAs second cladding layer 204 having a stripe-shaped ridge in the center is disposed on the active layer 203. An n type AlGaAs current blocking layer 205 is disposed on the second cladding layer 204, contacting both sides of the stripe-shaped ridge. A p type GaAs first cap layer 206 is disposed on the second cladding layer 204 at the top of the ridge. A p type GaAs second cap layer 209 is disposed on the current blocking layer 205, contacting both sides of the first cap layer 206. A p type GaAs contact layer 211 is disposed on the first and second cap layers 206 and 209. An n side ohmic electrode 215a is disposed on the rear surface of the GaAs substrate 201, and a p side ohmic electrode 215b is disposed on the contact layer 211.

FIGS. 25(a)–25(e) are sectional views illustrating process steps in a method of fabricating the laser structure shown in FIG. 24. In these figures, the same reference numerals as in FIG. 24 designate the same or corresponding parts. Reference numeral 207 designates an SiN mask.

Initially, there are successively grown on the n type GaAs substrate 201 the n type AlGaAs first cladding layer 202, the active layer 203, the p type AlGaAs second cladding layer 204, and the p type GaAs first Gap layer 206 by MOCVD (first crystal growth). Thereafter, an SiN film is deposited on the p type GaAs first cap layer 206 by plasma CVD and patterned in a stripe shape using conventional photolithography and etching techniques, forming an SiN mask 207 (FIG. 25(a)).

In the step of FIG. 25(b), a ridge structure having a reverse mesa shape is formed by wet etching of the first cap layer 206 and the second cladding layer 204 using the SiN mask 207.

Thereafter, the wafer is again set in the MOCVD apparatus, and the n type AlGaAs current blocking layer 205 and the p type GaAs second cap layer 209 are selectively grown on the second cladding layer 204 at the opposite sides of the ridge structure to bury the ridge structure (second crystal growth).

After removal of the SiN mask 207 (FIG. 25(d)), the p type GaAs contact layer 211 is grown over the entire surface of the wafer as shown in FIG. 25(e) (third crystal growth).

To complete the laser structure shown in FIG. 24, the n side ohmic electrode 215a and the p side ohmic electrode 215b are formed on the rear surface of the substrate 201 and on the contact layer 211, respectively, and facets are formed by cleaving.

As an example of a semiconductor laser fabricated in the above-described processing, there is a high-output power TQW (Triple Quantum Well) AlGaAs laser disclosed in, for example, SPIE Vol. 1634, Laser Diode Technology and Applications IV (1992), pp.323 to 328.

In the above-described fabrication method of the optical disk semiconductor laser shown in FIG. 24, since wet etching having poor controllability is employed for the formation of the ridge structure, it is difficult to accurately control the width w that determines the width of the active region and the thickness t of the remaining portion of the second cladding layer 204 that significantly influences the operating characteristics of the laser. That is, the ridge formation process employing wet etching is not suitable for mass production of lasers with uniform characteristics. If a selective etching with an etch stopping layer is employed for the ridge formation, the controllability of the thickness t of the second cladding layer 204 is improved. In this case, however, the introduction of the etch stopping layer may adversely affect the laser characteristics. If the ridge formation process employs HCl gas etching as described in Inst. Phys. Conf. Ser. No. 129, chapter 7, Paper represented at Int. Symp. GaAs and Related Compounds, Karuizawa, 1992, pp. 603–608, the controllability of the ridge width is improved. However, HCl gas etching provides poor controllability of the thickness t of the remaining portion of the second cladding layer 204.

Further, since the control of the ridge width w is difficult as described above, a reduction in the ridge width for a low threshold current cannot be easily achieved. Therefore, a laser that emits a laser beam having an almost circular shape in a section perpendicular to the beam traveling direction cannot be fabricated. That is, it is necessary to provide a completed laser with optical means, such as a lens, for concentrating the laser beam so that an appropriate beam diameter is obtained, resulting in a complicated system.

Further, since the second cladding layer 204 comprises AlGaAs that is easily oxidized, it is oxidized during the ridge etching process, whereby the crystalline quality of the blocking layer 205 regrown on the second cladding layer 204 is significantly degraded.

Further, since the fabrication process includes a lot of steps, i.e., the first epitaxial growth, the wet etching, the second epitaxial growth, the mask removal, and the third epitaxial growth, it is difficult to reduce the cost and improve the yield.

Meanwhile, FIG. 26 is a perspective view illustrating a semiconductor laser with a window structure grown on cleaved facets, that is disclosed in Japanese Journal of Applied Physics, Vol.30, (1991), pp. L904 to L906. In the figure, reference numeral 231 designates a p type GaAs substrate. An n type GaAs current blocking layer 232 is disposed on the substrate 231. A p type $Al_{0.33}Ga_{0.67}As$ cladding layer 233 is disposed on the current blocking layer 232. A p type $Al_{0.08}Ga_{0.92}As$ active layer 244 is disposed on the p type cladding layer 233. An n type $Al_{0.33}Ga_{0.67}As$ cladding layer 235 is disposed on the active layer 244. An n type GaAs contact layer 236 is disposed on the n type cladding layer 235. Reference numeral 237 designates a cleaved (110) facet, and numeral 238 designates an undoped $Al_{0.4}Ga_{0.6}As$ window layer grown on the facet 237.

The window structure employed in this prior art laser will be described in more detail.

In the AlGaAs high-output power laser, a lot of surface states are produced at the oscillation facets. The surface states cause a reduction in the band gap energy at the facets, compared with the band gap energy in the center of the laser. Therefore, regions adjacent to the facets become light absorption regions with respect to the wavelength of the laser light, and the localized heat generation in the light absorption regions increases with an increase in the light output. Since the band gap energy becomes smaller with the temperature rise, the absorption of the laser light is further encouraged, thereby increasing the temperature at the facets, i.e., so called positive feedback occurs. If the temperature rises sufficiently, localized melting of the semiconductor materials can occur, resulting in catastrophic optical damage (COD) that destroys the laser. COD is a serious problem in AlGaAs series high-output power lasers. In order to reduce the light absorption at the oscillation facets and increase the power level without risk of COD, window layers having a band gap energy higher than a band gap energy equivalent to the oscillation wavelength of the laser are disposed on the oscillation facets of the laser.

A description is given of a fabrication process for the window layer 238 in the laser structure shown in FIG. 26.

Initially, the laser structure is fabricated using conventional wet etching and LPE growth. More specifically, after growth of the n type GaAs current blocking layer 232 on the p type GaAs substrate 231, a stripe-shaped groove is formed in the center of the element so that it penetrates through the current blocking layer 232 and reaches into the substrate 231. Thereafter, the p type $Al_{0.33}Ga_{0.67}As$ cladding layer 233, the p type $Al_{0.08}Ga_{0.92}As$ active layer 233, the n type $Al_{0.33}Ga_{0.67}As$ cladding layer 235, and the n type GaAs contact layer 236 are successively grown on the wafer. After grinding the wafer to a desired thickness, the wafer is cleaved in a plurality of bars each having a width equal to the resonator length of the laser. The resonator length of a typical high-output power laser is 300~600 μm. Finally, a material having a band gap energy larger than the band gap energy equivalent to the oscillation wavelength is grown on portions of the bar-shaped wafer corresponding to the resonator facets, preferably by MOCVD.

In this prior art laser, since the laser oscillation wavelength is 830 nm, which is equivalent to 1.49 eV, an undoped $Al_{0.4}Ga_{0.6}As$ layer having a band gap energy of about 1.93 eV is employed as the window layer 238. After formation of electrodes and coating of the surfaces of the window layers, the bar-shaped wafer is divided into a plurality of laser chips, completing the laser structure shown in FIG. 26. In the prior art literature, Japanese Journal of Applied Physics, Vol.30, L904 to L906, it is reported that the window layer prevents COD and increases the output power and lifetime of the laser.

However, the prior art laser with the window structure shown in FIG. 26 has the following drawbacks.

The laser structure shown in FIG. 26 is fabricated through the complicated process steps as described above. Generally, in fabrication of semiconductor lasers, process steps until the formation of electrodes are carried out on a wafer to secure mass production with high reproducibility. That is, the fabrication method of the prior art laser shown in FIG. 26, in which the window layers are formed on portions corresponding to resonator facets after cleaving of the wafer into the bars each having a width equivalent to the resonator length, provides very poor productivity, so that this method is not useful industrially. Further, when the window layers are grown by MOCVD after the formation of the resonator facets by cleaving, the cleaved facets are easily oxidized and surface states are produced thereon as long as the cleaving is performed in the air. Since the surface states on the facets adversely affect the effect of the window layers, the process steps from the cleaving to the growth of the window layers must be carried out in an inactive gas or in vacuum to avoid the generation of the surface states.

FIG. 27 is a perspective view illustrating a facet non-injection type laser array disclosed in, for example, SPIE Vol.1418, Laser Diode Technology and Applications III (1991), pp. 363–371. In the figure, reference numeral 311 designates a p type GaAs substrate. An n type GaAs current blocking layer 312 is disposed on the p type GaAs substrate 311. A p type $Al_xGa_{1-x}As$ lower cladding layer 313 is disposed on the current blocking layer 312. An $Al_yGa_{1-y}As$ (x>y) active layer 314 is disposed on the lower cladding layer 313. An n type $Al_xGa_{1-x}As$ upper cladding layer 315 is disposed on the active layer 314. An n type GaAs cap layer 316 is disposed on the upper cladding layer 315. An n side ohmic electrode 317a and a p side ohmic electrode 317b are disposed on the rear surface of the substrate 311 and on the cap layer 316, respectively.

FIGS. 28(a)–28(d) are perspective views illustrating process steps in a method of fabricating the laser array shown in FIG. 27. This laser array is fabricated through two liquid phase epitaxy (LPE) steps.

Initially, as illustrated in FIG. 28(a), the n type GaAs current blocking layer 312 is grown on the p type GaAs substrate 311 (first LPE growth). Then, as illustrated in FIG. 28(b), a plurality of stripe-shaped grooves are formed in the current blocking layer 312 at intervals of 100 μm by wet etching. Each groove penetrates through the current blocking layer 312 at a region 330 in the center of the resonator but does not penetrate through the current blocking layer 312 at regions 331 adjacent to the facets. When such stripe-shaped grooves are fabricated by wet etching, two etching steps using two different masks are required. The region 330 in which the groove penetrates through the current blocking layer 312 is a current injected region, and the regions 331 in which the groove does not penetrate through the current blocking layer 312 are current blocking regions. The length of each current blocking region is 20 μm, and the channel width of the current injected region is 5.5 μm. The length of the resonator is 600 μm.

Thereafter, as illustrated in FIG. 28(c), the p type $Al_xGa_{1-x}As$ lower cladding layer 313, the $Al_yGa_{1-y}As$ active layer 314, the n type $Al_xGa_{1-x}As$ upper cladding layer 315, and the n type GaAs cap layer 316 are successively grown on the wafer (second LPE growth). Then, as illustrated in FIG. 28(d), the n side ohmic electrode 317a and the p side ohmic electrode 317b are formed by metallizing, and a plurality of grooves 320 having a depth of 20 μm and reaching the substrate 311 are formed by etching, thereby electrically separating the laser elements from each other. Finally, front and rear facets are formed by cleaving, followed by coating of the facets to provide the front and rear facets with a reflectivity of 8% and a reflectivity of 80%, respectively, whereby the laser array shown in FIG. 27 is completed.

In the above-described facet non-injection laser, the density of light at the facets is relatively reduced by the current non-injection regions 331 adjacent to the facets, whereby the COD level is increased. As shown in FIG. 28(b), the current non-injection regions 331 are realized by the grooves that do not penetrate through the current blocking layer 312 in the regions 331. However, it is difficult to produce the grooves using by only one wet etching step. In order to produce the grooves with high reproducibility, two mask patterning and wet etching steps are required, resulting in a very poor productivity.

SUMMARY OF THE INVENTION

It is an object of the present invention to provide a relatively simple method for fabricating a semiconductor laser having a narrow stripe in an active region with high reproducibility.

It is another object of the present invention to provide a semiconductor laser having a narrow stripe, good circularity of the emitted laser beam, and a structure applicable to a laser array, and a relatively simple method for fabricating the semiconductor laser with high reproducibility.

It is still another object of the present invention to provide a semiconductor laser with a window region, a current non-injection region, or a ridge tapering region adjacent to a facet, that has a narrow stripe, good circularity of the emitted laser beam, and a structure applicable to a laser array, and a relatively simple method for fabricating the semiconductor laser with high reproducibility.

Other objects and advantages of the invention will become apparent from the detailed description that follows. The detailed description and specific embodiments described are provided only for illustration singe various additions and modifications within the scope of the invention will be apparent to those of skill in the art from the detailed description.

According to a first aspect of the present invention, a method of fabricating a semiconductor laser includes growing a semiconductor multilayer structure comprising a first conductivity type cladding layer, an active layer, a second conductivity type cladding layer, and a first conductivity type current blocking layer on a first conductivity type substrate; forming an insulating film having a stripe-shaped opening on a part of the semiconductor multilayer structure; using the insulating film as a mask, etching the semiconductor multilayer structure by using an etching method in which the etching rate in the direction perpendicular to a prescribed crystal plane of the semiconductor multilayer structure is significantly lower than the etching rate in other directions, thereby forming a stripe-shaped V groove having inner side surfaces in the crystal plane, which V groove serves as a current path for introducing current into the active layer; growing a second conductivity type semiconductor layer in the stripe-shaped V groove; and growing a second conductivity type contact layer over the wafer. In this method, singe the stripe-shaped V groove that determines the stripe width of the active region is produced with high controllability, a semiconductor laser with a narrow stripe is fabricated with high reproducibility.

According to a second aspect of the present invention, a semiconductor laser includes a first conductivity type semiconductor substrate; a semiconductor multilayer structure grown on the substrate and comprising a first conductivity type cladding layer, an active layer, a second conductivity type cladding layer, and a first conductivity type current blocking layer; a stripe-shaped V groove penetrating through a part of the semiconductor multilayer structure and reaching into the second cladding layer; and a second conductivity type semiconductor layer grown in the stripe-shaped V groove. This laser structure provides a stripe-shaped active region having a sufficiently narrow width, a low threshold current, and a laser beam having an almost circular section.

According to a third aspect of the present invention, a method of fabricating a semiconductor laser includes growing a semiconductor multilayer structure comprising a first conductivity type cladding layer, an active layer, and a second conductivity type cladding layer on a first conductivity type substrate; patterning a stripe-shaped insulating film on a part of the semiconductor multilayer structure; using the insulating film as a mask, selectively growing a first conductivity type current blocking layer on regions of the semiconductor multilayer structure, which regions sandwich the insulating film; and growing a second conductivity type semiconductor layer after removal of the insulating film. Therefore, a semiconductor laser including a stripe-shaped active region with a sufficiently narrow width is easily fabricated with high reproducibility.

According to a fourth aspect of the present invention, a semiconductor laser includes a semiconductor multilayer structure grown on a first conductivity type substrate and comprising a first conductivity type cladding layer, an active layer, and a second conductivity type cladding layer; first conductivity type current blocking layers grown on the semiconductor multilayer structure and facing each other with a stripe-shaped region between; and a second conductivity type semiconductor layer grown on the region between the current blocking layers. This laser structure ensures a stripe-shaped active region with a sufficiently narrow width, a low threshold value, and a laser beam having an almost circular cross-section.

According to a fifth aspect of the present invention, a method of fabricating a semiconductor laser includes growing a semiconductor multilayer structure comprising a first conductivity type cladding layer, an active layer, a second conductivity type cladding layer, and a first conductivity type current blocking layer on a first conductivity type substrate; forming an insulating film with a stripe-shaped opening on a part of the semiconductor multilayer structure so that the stripe-shaped opening extends in what becomes the resonator length direction of the laser and the width of the opening is wider in a first region adjacent to a laser emitting facet than in a second region; using the insulating film as a mask, etching the semiconductor multilayer structure using an etching method in which the etching rate in the direction perpendicular to a prescribed crystal plane of the semiconductor multilayer structure is significantly lower than the etching rate in other directions, thereby forming a stripe-shaped V groove having inner side surfaces in the crystal plane and, reaching into the first conductivity type cladding layer in the first region whereas, and reaching into the second conductivity type cladding layer in the second region; growing a second conductivity type semiconductor layer in the stripe-shaped V groove; and growing a second conductivity type contact layer over the wafer. Therefore, a semiconductor laser including a stripe-shaped active region with a sufficiently narrow width and a window region adjacent to the laser emitting facet is easily fabricated with high reproducibility.

According to a sixth aspect of the present invention, a semiconductor laser includes a first conductivity type semiconductor substrate; a semiconductor multilayer structure grown on the substrate and comprising a first conductivity type cladding layer, an active layer, a second conductivity type cladding layer, and a first conductivity type current blocking layer; a stripe-shaped V groove formed in the semiconductor multilayer structure, extending in the resonator length direction and, reaching into the first conductivity type cladding layer in a first region adjacent to the laser emitting facet, and reaching into the second conductivity type cladding layer in a second region; and a second conductivity type semiconductor layer grown in the stripe-shaped V groove. This laser structure provides a window region adjacent to the laser emitting facet, a stripe-shaped active region with a sufficiently narrow width, a low threshold current, and a laser beam having an almost circular cross-section.

According to a seventh aspect of the present invention, a method for fabricating a semiconductor laser includes growing a semiconductor multilayer structure comprising a first conductivity type cladding layer, an active layer, a second conductivity type cladding layer, and a first conductivity type current blocking layer on a first conductivity type substrate; forming an insulating film having a stripe-shaped opening on a part of the semiconductor multilayer structure so that the opening extends in what becomes the resonator length direction of the laser and the width of the opening is narrower in a first region adjacent to a laser emitting facet than in a second region; using the insulating film as a mask, etching the semiconductor multilayer structure using an etching method in which the etching rate in the direction perpendicular to a prescribed crystal plane of the semiconductor multilayer structure is significantly lower than the etching rate in other directions, thereby forming a stripe-shaped V groove having inner side surfaces in the crystal plane, reaching into the first conductivity type current blocking layer in the first region, and reaching into the second conductivity type cladding layer in the second region; growing a second conductivity type semiconductor layer in the stripe-shaped V groove; and growing a second conductivity type contact layer over the wafer. Therefore, a semiconductor laser including a stripe-shaped active region with a sufficiently narrow width and a current non-injection region adjacent to the laser emitting facet is easily fabricated with high reproducibility.

According to an eighth aspect of the present invention, a semiconductor laser includes a first conductivity type semiconductor substrate; a semiconductor multilayer structure grown on the substrate and comprising a first conductivity type cladding layer, an active layer a second conductivity type cladding layer, and a first conductivity type current blocking layer; a stripe-shaped V groove extending in the resonator length direction of the laser, reaching into the first conductivity type current blocking layer in a first region adjacent to the laser emitting facet, and reaching into the second conductivity type cladding layer in a second region other than the first region; and a second conductivity type semiconductor layer grown in the stripe-shaped V groove. This laser structure provides a current non-injection region adjacent to the laser emitting facet, a stripe-shaped active region with a sufficiently narrow width, a low threshold current, and a laser beam having an almost circular cross-section.

According to a ninth aspect of the present invention, a method of fabricating a semiconductor laser includes growing a semiconductor multilayer structure comprising a first conductivity type cladding layer, an active layer, a second conductivity type cladding layer, and a first conductivity type current blocking layer on a first conductivity type substrate; forming an insulating film on the semiconductor multilayer structure so that a stripe-shaped opening extending in what becomes the resonator length direction is formed in a prescribed region other than a region adjacent to a laser emitting facet; using the insulating film as a mask, etching the semiconductor multilayer structure using an etching method in which the etching rate in the direction perpendicular to a prescribed crystal plane of the semiconductor multilayer structure is significantly lower than the etching rate in other directions, thereby forming a stripe-shaped V groove in the prescribed region so that the groove has inner side surfaces in the crystal plane and reaches into the second conductivity type cladding layer; growing a second conductivity type semiconductor layer in the stripe-shaped V groove; and growing a second conductivity type contact layer over the wafer. Therefore, a semiconductor laser including a stripe-shaped active region with a sufficiently narrow width and a current non-injection region adjacent to the laser emitting facet is easily fabricated with high reproducibility.

According to a tenth aspect of the present invention, a semiconductor laser includes a first conductivity type semiconductor substrate; a semiconductor multilayer structure grown on the substrate and comprising a first conductivity type cladding layer, an active layer, a second conductivity type cladding layer, and a first conductivity type current blocking layer; a stripe-shaped V groove formed in a prescribed region of the multilayer structure other than a region adjacent to the laser emitting facet and extending in the resonator length direction; and a second conductivity type semiconductor layer grown in the stripe-shaped V groove. This laser structure provides a current non-injection region adjacent to the laser emitting facet, a stripe-shaped active region with a sufficiently narrow width, a low threshold current, and a laser beam having an almost circular cross-section.

According to an eleventh aspect of the present invention, a method of fabricating a semiconductor laser includes growing a semiconductor multilayer structure comprising a first conductivity type cladding layer, an active layer, a second conductivity type cladding layer, and a first conductivity type current blocking layer on a first conductivity type substrate; forming an insulating film having a stripe-shaped opening on a part of the semiconductor multilayer structure so that the stripe-shaped opening extends in what becomes the resonator length direction and tapers toward a laser emitting facet in a first region adjacent to the laser emitting facet whereas it has a uniform width in a second region; using the insulating film as a mask, etching the semiconductor multilayer structure by an etching method in which the etching rate in the direction perpendicular to a prescribed crystal plane of the semiconductor multilayer structure is significantly lower than the etching rate in other directions, thereby forming a stripe-shaped V groove having inner side surfaces in the crystal plane and reaching into the second conductivity type cladding layer in which the distance between the tip of the V shape and the active layer gradually increases in a region adjacent to a laser emitting facet toward the facet; growing a second conductivity type semiconductor layer in the stripe-shaped V groove; and growing a second conductivity type contact layer over the wafer. Therefore, a semiconductor laser including a stripe-shaped active region that has a narrow and uniform width in the center of the structure and a tapered width in a region adjacent to the laser emitting facet is easily fabricated with high reproducibility.

According to a twelfth aspect of the present invention, a semiconductor laser includes a first conductivity type semiconductor substrate; a semiconductor multilayer structure grown on the substrate and comprising a first conductivity type cladding layer, an active layer, a second conductivity type cladding layer, and a first conductivity type current blocking layer; a stripe-shaped V groove formed in the semiconductor multilayer structure and extending in the resonator length direction in which the distance between the tip of the V shape and the active layer gradually increases in a region adjacent to the laser emitting facet toward the facet; and a second conductivity type semiconductor layer grown in the stripe-shaped V groove. This laser structure provides a stripe-shaped active region having a width that is sufficiently narrow and tapered toward the laser emitting facet in a region adjacent to the facet, a low threshold current, and a laser beam having an almost circular cross-section.

According to a thirteenth aspect of the present invention, in the above-described fabrication methods for semiconductor lasers, the insulating mask used for etching of the V grooves includes stripe-shaped opening patterns and cleavage inducing patterns on prescribed positions on cleavage lines. The wafer is cleaved at the cleavage inducing grooves formed on the wafer using the cleavage inducing patterns, so that the laser facets are produced with high controllability.

DETAILED DESCRIPTION OF THE PREFERRED EMBODIMENTS

Embodiment 1

Figure 1:
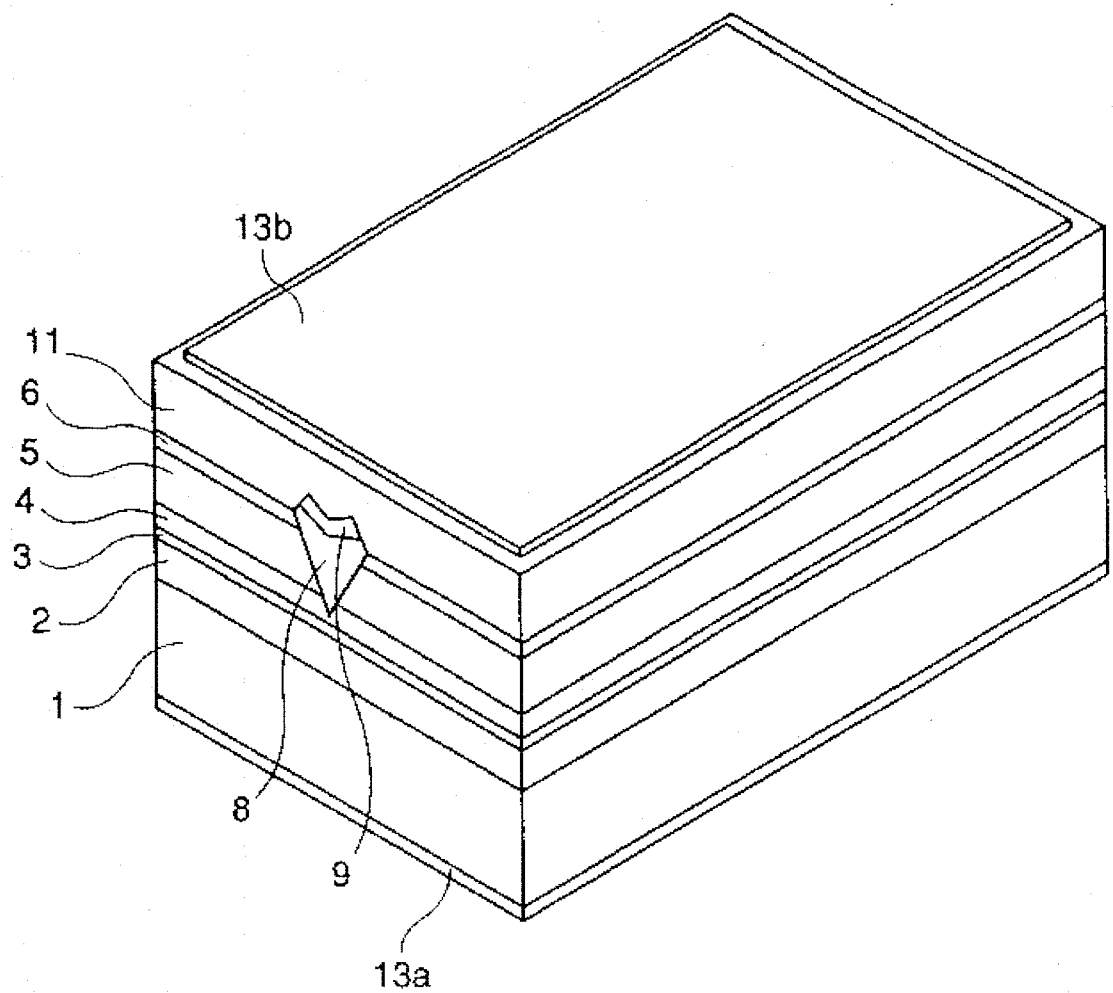
FIG. 1 is a perspective view illustrating a semiconductor laser in accordance with a first embodiment of the invention.

FIG. 1 is a perspective view illustrating a semiconductor laser in accordance with a first embodiment of the present invention. In the figure, reference numeral 1 designates an n type GaAs substrate. An n type AlGaAs first cladding layer 2 is disposed on the substrate 1. An AlGaAs TQW (Triple Quantum Well)—SCH (Separate Confinement Heterostructure) active layer 3 is disposed on the first cladding layer 2. A p type AlGaAs second cladding layer 4 is disposed on the active layer 3. An n type AlGaAs current blocking layer 5 is disposed on the second cladding layer 4. A p type GaAs cap layer 6 is disposed on the current blocking layer 5. A V-shaped groove penetrates through the p type GaAs cap layer 6 and the n type AlGaAs current blocking layer 5 and reaches into the p type AlGaAs second cladding layer 4 in the center of the structure. A p type AlGaAs layer 8 is disposed in the V-shaped groove, contacting the layers 4, 5, and 6. A p type GaAs cap layer 9 is disposed on the AlGaAs layer 8. A p type GaAs contact layer 11 is disposed on the p type GaAs cap layers 6 and 9. An n side ohmic electrode 13a is disposed on the rear surface of the substrate 1, and a p side ohmic electrode 13b is disposed on the contact layer 11.

FIGS. 2(a)–2(e) are sectional views taken along a (011) plane, illustrating process steps in a method of fabricating the semiconductor laser of FIG. 1. In the figures, the same reference numerals as in FIG. 1 designate the same or corresponding parts. Reference numeral 7 designates an SiN mask, numeral 7a designates an opening of the mask 7, numeral 12 designates a V-shaped groove, and numerals 12a and 12b designate side walls of the V-shaped groove 12.

Figure 2:
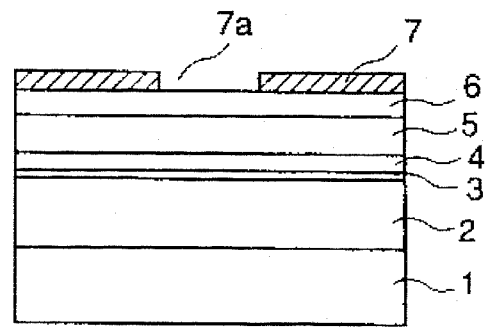
FIGS. 2(a)–2(e) are sectional views taken along a (011) plane, illustrating process steps in a method for fabricating the semiconductor laser of FIG. 1.
Figure 2:
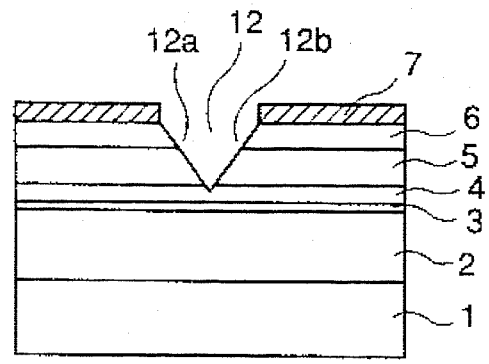
Figure 2:
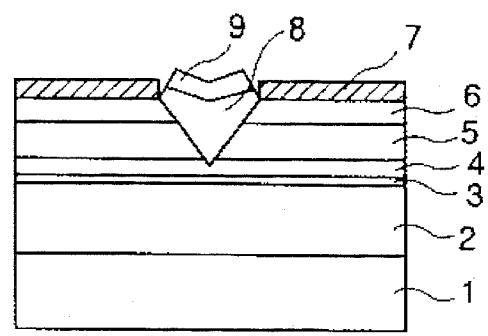
Figure 2:
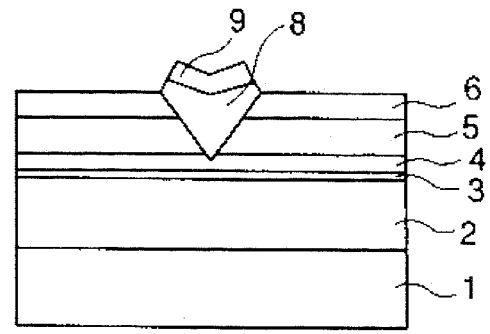
Figure 2:
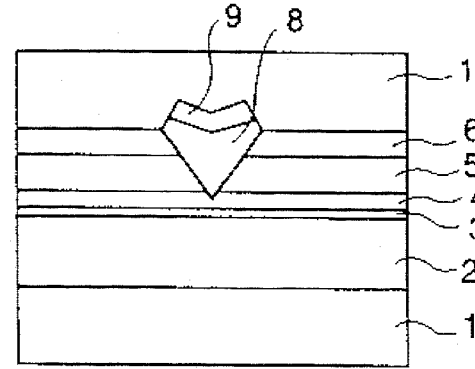

Initially, as illustrated in FIG. 2(a), there are successively grown on the n type GaAs substrate 1 with a (100) surface orientation by MOCVD, the n type AlGaAs first cladding layer 2 about 1.5 µm thick, the AlGaAs TQW-SCH active layer 3, the p type AlGaAs second cladding layer 4 about 0.4 µm thick, the n type AlGaAs current blocking layer 5 about 1.2 µm thick, and the p type GaAs cap layer 6 about 0.6 µm thick. Thereafter, an SiN film having a thickness of 100 nm is deposited on the p type GaAs cap layer 6 by plasma CVD and patterned by conventional photolithography and etching technique to form an SiN mask 7 having a stripe-shaped opening 7a extending in the [011] direction. Thereafter, the wafer is immersed in an ammonium sulfide solution, whereby a thin oxide film on an unmasked part of the surface of the GaAs cap layer 6 is etched away and a sulfur film is formed on that part of the GaAs cap layer 6.

In the step of FIG. 2(b), the structure is selectively etched at the opening 7a of the SiN mask 7 with HCl gas using a gas mixture of AsH$_3$ (arsine), HCl, and H$_2$, forming a V-shaped groove 12.

Figure 3:
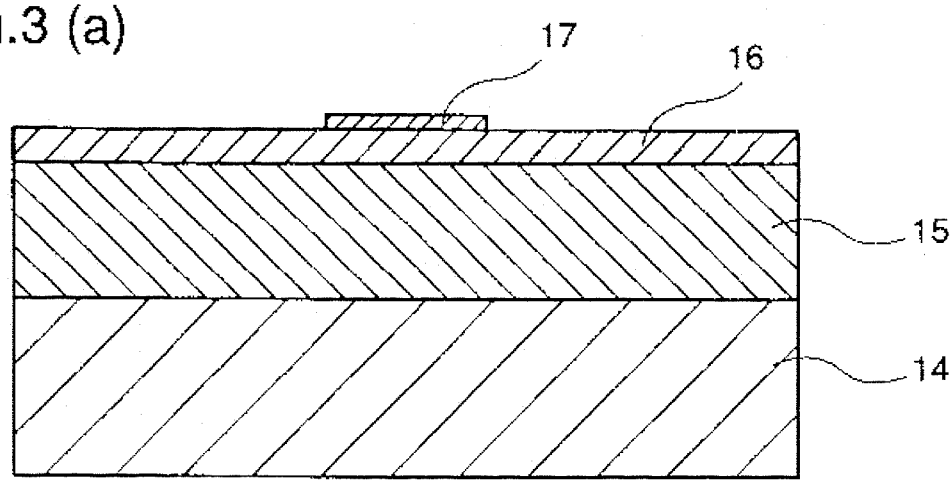
FIGS. 3(a)–3(c) are sectional views for explaining a relation between stripe direction of a mask pattern and an etching configuration in HCl gas etching.
Figure 3:
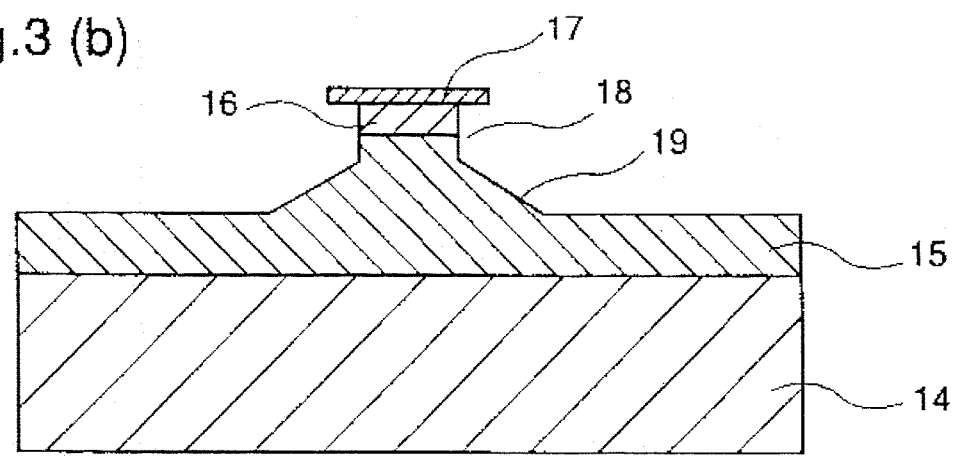
Figure 3:
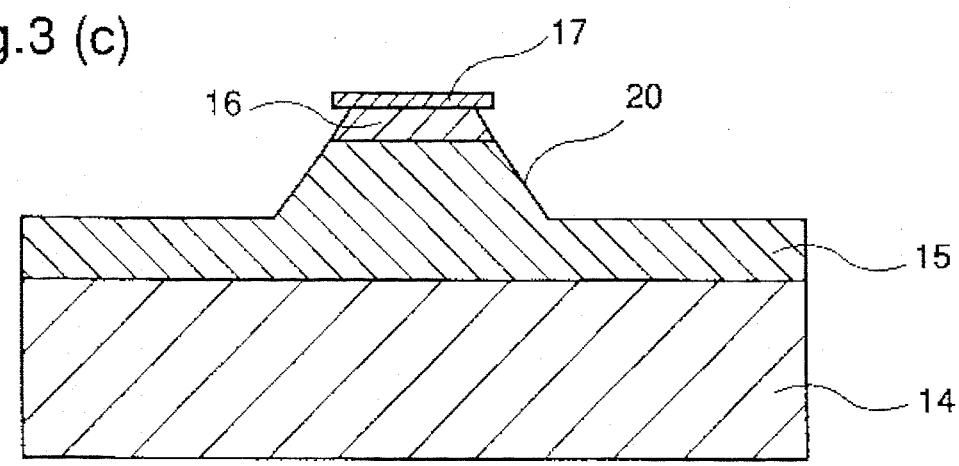

FIGS. 3(a)–3(c) are sectional views for explaining a relation between the stripe direction of the mask pattern and the etching configuration in the above-described HCl gas etching using the gas mixture. In the figures, reference numeral 14 designates a GaAs substrate, numeral 15 designates an AlGaAs layer, numeral 16 designates a GaAs cap layer, and numeral 17 designates a stripe-shaped pattern of an SiN film. In FIG. 3(a), the AlGaAs layer 15 and the GaAs cap layer 16 are successively grown on the (100) surface of the GaAs substrate 14, and the stripe-shaped SiN pattern 17 is formed on the cap layer 16. The etching configuration depends on the stripe direction of the SiN pattern 17. FIG. 3(b) illustrates the etching configuration when the wafer is etched after patterning of the SiN film 17 in the [0$\bar{1}$1] direction, and FIG. 3(c) illustrates the etching configuration when the wafer is etched after patterning of the SiN film 17 in the [011] direction. As shown in FIG. 3(b), when the stripe direction of the SiN pattern 17 is [0$\bar{1}$1], a ridge structure having a (011) plane 18 and a (311) plane 19 at the side surface is formed. On the other hand, as shown in FIG. 3(c), when the stripe direction of the SiN pattern 17 is [011], a ridge structure having a (111)B plane 20 at the side surface is formed.

When the HCl gas etching is carried out with the AsH$_3$ partial pressure in a range of 0.008~0.08 Torr and the flow ratio of the AsH$_3$ gas to the HCl gas lower than 2.5, the side surfaces of the ridge produced by the etching are extremely flat and as smooth as a cleaved plane. Therefore, there is no step on the side surfaces of the ridge at the boundary between the AlGaAs layer 15 and the GaAs cap layer 16. The AsH$_3$ partial pressure is obtained by dividing the AsH$_3$ flow rate by the total flow rate and multiplying by the pressure in the reaction chamber. The gas mixture may comprise Cl$_2$ in place of HCl, and C$_4$H$_9$AsH$_2$ (tertiary butyl arsine) or (CH$_3$)$_3$As (trimethylarsine) in place of AsH$_3$.

According to the above-described HCl gas etching, when a mask pattern with a stripe-shaped opening extending in the [011] direction is employed, since the etching proceeds so that the (111)B plane is exposed at the etched surface and the etching hardly proceeds in the [111]B direction, the etching automatically stops when a V-shaped groove is produced. Therefore, the depth of the etching depends on the width of the opening 7a of the SiN mask 7. In the step of FIG. 2(a), if the width of the opening a of the SiN mask 7 is designed so that the end of the V-shaped groove reaches into the p type AlGaAs second cladding layer 4, the structure shown in FIG. 2(b) is easily fabricated with high reproducibility.

Figure 4:
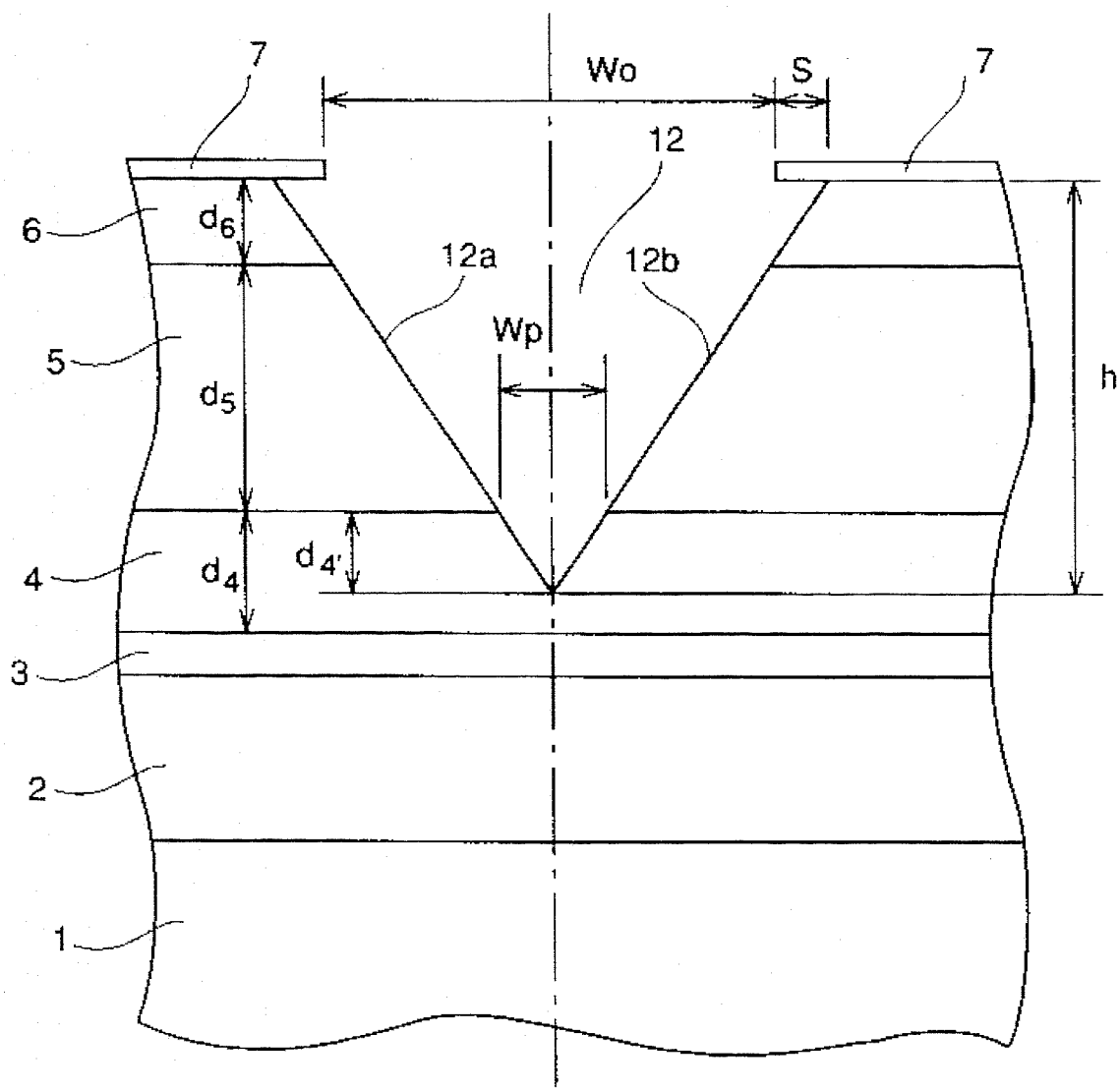
FIG. 4 is a sectional view for explaining specific measures of parts of the laser structure according to the first embodiment of the invention.

FIG. 4 is a schematic diagram for explaining measures of parts of the structure in the step of FIG. 2(b). In FIG. 4, the same reference numerals as in FIG. 1 designate the same or corresponding parts. In the figure, d6 represents the thickness of the p type GaAs cap layer 6, d5 the thickness of the n type GaAs current blocking layer 5, d4 the thickness of the p type AlGaAs second cladding layer 4, d4' the etching depth in the p type AlGaAs second cladding layer 4, h the total etching depth, S the width of the side-etched portion under the SiN mask 7, Wo the width of the opening of the SiN mask 7, and Wp the space between the n type AlGaAs current blocking layers 5 separated by the V-shaped groove 12.

The typical thicknesses for d4, d5, and d6 are 0.4 µm, 1.2 µm, and 0.6 µm, respectively. Since it is necessary that the end of the V-shaped groove 12 reaches into the p type AlGaAs second cladding layer 4 but does not reach the active layer 3, d4' must be in a range of 0<d4'<d4. On the other hand, since the inner side surfaces 12a and 12b of the V-shaped groove 12 are in the (111)B plane, each of the side surfaces 12a and 12b forms an angle of about 54.7° with the surface of the semiconductor layer. Therefore, assuming that the typical thickness for d4' is 0.3 µm, the following relation is obtained:

$$Wp = 2d4'/\tan 54.7° = 0.6/1.412 = 0.42 (\mu m)$$

The width Wo of the opening of the SiN mask 7 has the following relation, that is:

$$\{(Wo/2)+S\} \tan 54.7° = h$$

Assuming that the width S of the side-etched portion is 0.5 µm, the following relation is obtained:

$$Wo = (2h/\tan 54.7°) - 2S = (4.2/1.412) - 1.0 = 1.97 (\mu m)$$

Therefore, by setting the width of the opening 7a of the SiN mask 7 to 1.97 µm in the step of FIG. 2(a), the V-shaped groove 12 in which the space Wp between the n type AlGaAs current blocking layers 5 separated by the V-shaped groove 12 is 0.42 µm is easily fabricated with high reproducibility.

After the fabrication of the V-shaped groove 12, the p type AlGaAs layer 8 about 1.5 µm thick in the center thereof and the p type GaAs cap layer 9 about 0.4 µm thick are selectively grown in the V-shaped groove 12 as shown in FIG. 2(c). It is desirable that the fabrication of the groove 12 (FIG. 2(b)) and the selective growth of the layers 8 and 9 are performed in the same chamber so that the wafer is not exposed to air. Alternatively, those steps may be carried out in different chambers with an automatic carrier system that transports the wafer in an H$_2$ ambient or an inert gas ambient between the chambers.

After removal of the SiN mask 7 (FIG. 2(d)), the p type GaAs contact layer 11 about 3 µm thick is grown as shown in FIG. 2(e). Thereafter, the n side ohmic electrode 13a and the p side ohmic electrode 13b are formed on the rear surface of the substrate 1 and on the contact layer 11, respectively, followed by cleaving to make resonator facets and division of the wafer into chips, thereby completing the semiconductor laser shown in FIG. 1.

As described above, according to the first embodiment of the invention, after the growth of the semiconductor multilayer structure comprising the n type cladding layer 2, the active layer 3, the p type cladding layer 4, and the n type current blocking layer 5 on the n type GaAs substrate 1, the insulating film pattern 7 having a stripe-shaped opening is formed on the semiconductor multilayer structure. Using the insulating film pattern 7 as an etching mask, the semiconductor multilayer structure is etched by HCl gas etching in which the etching rate in the direction perpendicular to a prescribed crystal plane, i.e., the (111)B plane, is significantly lower than the etching rate in other directions, thereby forming the stripe-shaped V groove 12 having inner side surfaces in the (111)B plane. The V groove 12 is a current path for injecting current into the active layer 3. Then, the V groove 12 is filled with the p type semiconductor layer 8, followed by growth of the p Type contact layer 11 over the wafer. Therefore, the stripe-shaped V groove 12 that determines the width of the active region is produced with high controllability and reproducibility, whereby a semiconductor laser with a narrow active region is easily fabricated with high reproducibility. When the above-described process steps according to the first embodiment of the invention are applied to fabrication of a laser array, a laser array including a plurality of laser elements with uniform characteristics is easily fabricated.

Furthermore, the semiconductor laser according to the first embodiment of the invention includes the semiconductor multilayer structure grown on the n type semiconductor substrate 1 and comprising the n type cladding layer 2, the active layer 3, the p type cladding layer 4, and the n type current blocking layer 5. The stripe-shaped V groove 12 is formed in the semiconductor multilayer structure to reach into the p type cladding layer 4, and the p type semiconductor layer 8 grown in the stripe-shaped V groove 12. In this structure, the width of the stripe-shaped active region can be arbitrarily set by controlling the depth of the stripe-shaped V groove 12 and the thickness of the p type AlGaAs second cladding layer 4. As a result, a semiconductor laser having a narrow active region and a low threshold current and emitting a laser beam with an almost circular cross-section is realized.

Furthermore, in the above-described fabrication process, the GaAs cap layer 6 is grown subsequently to the AlGaAs current blocking layer 5, and the wafer is immersed in an ammonium sulfide solution after formation of the SiN mask 7, followed by the gas etching using a gas mixture including HCl. This etching method was disclosed in Japanese Published Patent Application No. Hei. 5-44869 by one of the inventors of the present invention. Hereinafter, this etching technique will be described in more detail.

When a narrow structure, such as a groove, is formed in an AlGaAs layer by HCl gas etching using an insulating mask pattern and the structure is filled with a compound semiconductor, an oxide film on the surface of the AlGaAs layer reacts with HCl and the products are attached to the surface of the wafer and segregated on the regrowth interface. The segregation of O and Cl on the regrowth interface adversely affects the quality of the regrown layer. In the above-described first embodiment, after the HCl gas etching of the AlGaAs current blocking layer 5 with the SiN mask 7 to form the V groove 12, the V groove 12 is filled with the AlGaAs layer 8. During the HCl gas etching, O and Cl are segregated on the inner surface of the V groove 12 and adversely affect the quality of the AlGaAs layer 8. However, if a GaAs cap layer is grown subsequent to the AlGaAs layer, the oxidation of the AlGaAs layer that is later dry-etched is suppressed, and the above-described segregation of O and Cl on the regrowth interface can be reduced. However, the segregation of O and Cl on the regrowth interface still occurs due to a very thin oxide film on the surface of the GaAs cap layer, the GaAs cap layer is not sufficient to secure a clean surface of the AlGaAs layer after the etching. Therefore, in the first embodiment of the invention, the wafer is immersed in an ammonium sulfide solution before the etching of the AlGaAs layer, whereby the oxide film on the surface of the GaAs cap layer is etched away and the surface of the GaAs cap layer is coated with a sulfur film. Thereafter, in HCl gas etching, the sulfur film is removed and the GaAs cap layer and the AlGaAs layer are patterned in a desired shape. Using the above-described etching technique, unwanted segregation of O and Cl on the regrowth interface is significantly suppressed, and the quality of the crystal layer regrown on the etched surface is significantly improved.

Embodiment 2

Figure 5:
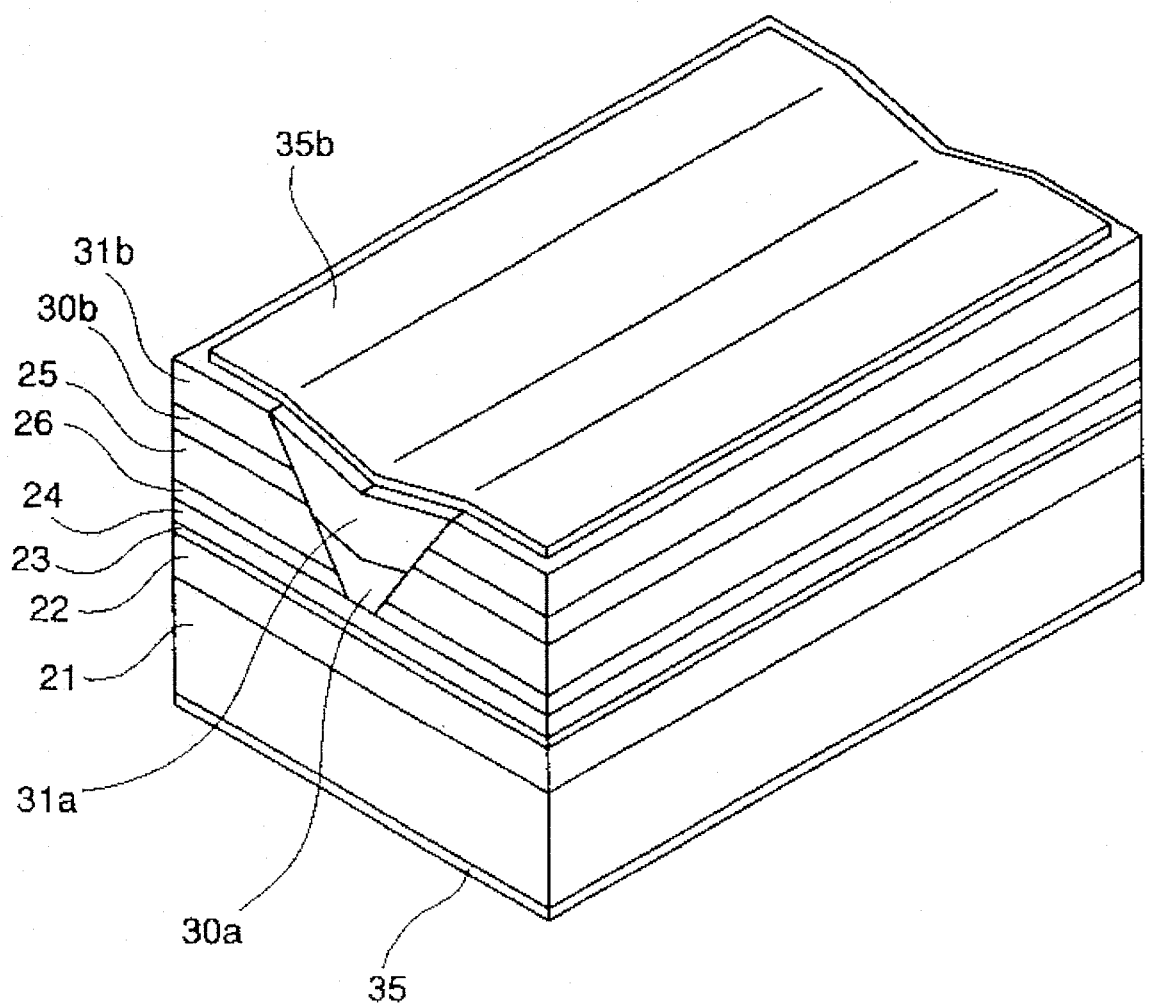
FIG. 5 is a perspective view illustrating a semiconductor laser in accordance with a second embodiment of the present invention.

FIG. 5 is a perspective view illustrating a semiconductor laser in accordance with a second embodiment of the present invention. In the figure, reference numeral 21 designates an n type GaAs substrate. An n type AlGaAs first cladding layer 22 is disposed on the GaAs substrate 21. An active layer 23 is disposed on the first cladding layer 22. A p type AlGaAs second cladding layer 24 is disposed on the active layer 23. A stripe-shaped first p type AlGaAs layer 30a is disposed on a center part of the second cladding layer 24. First p type GaAs cap layers 26 are disposed on the second cladding layer 24 at opposite sides of the first AlGaAs layer 30a. N type AlGaAs current blocking layers 25 are disposed on the first p type GaAs cap layers 26. A first p type GaAs contact layer 31a is disposed on the first AlGaAs layer 30a. Second p type AlGaAs layers 30b are disposed on the current blocking layers 25. Second p type GaAs contact layers 31b are disposed on the second AlGaAs layers 30b. An n side ohmic electrode 35a is disposed on the rear surface of the substrate 21, and a p side ohmic electrode 35b is disposed on the first and second contact layers 31a and 31b.

FIGS. 6(a)–6(e) are sectional views illustrating process steps in a method of fabricating the semiconductor laser of FIG. 5. These sectional views are taken along a (011) plane of the structure. In the figures, the same reference numerals as in FIG. 5 designate the same or corresponding parts. Reference numeral 27 designates an SiN mask, and numeral 29 designates a second p type GaAs cap layer.

Initially, as illustrated in FIG. 6(a), the n type AlGaAs first cladding layer 22 about 1.5 µm thick, the active layer 23 having a TQW-SCH structure, the p type AlGaAs second cladding layer 24 about 0.3 µm thick, and the p type GaAs cap layer 26 about 0.1 µm thick are successively grown on a (100) oriented surface of the n type GaAs substrate 21 by MOCVD. Thereafter, an SiN film about 100 nm thick is deposited on the GaAs cap layer 26 by plasma CVD and patterned in a stripe shape extending in the [011] direction, resulting in a stripe-shaped SiN mask 27. An SiN mask about 0.5 µm wide is appropriate for a reduction in the threshold current of the laser.

In the step of FIG. 6(b), the n type $Al_xGa_{1-x}As$ ($0 \leq x \leq 1$) current blocking layer 25 and the second p type GaAs cap layer 29 are selectively grown on the first p type GaAs cap layer 26 at regions of the SiN mask 27 by MOCVD. In the selective growth on the regions sandwiching the stripe-shaped SiN mask 27 extending in the [011] direction, the current blocking layer 25 and the GaAs cap layer 29 grow so that (111)B side walls are formed at the both sides of the stripe-shaped SiN mask 27. The selective growth of the AlGaAs current blocking layer 25 and the GaAs cap layer 29 employs an HCl gas added MOCVD process disclosed in Japanese Published Patent Application No. Hei. 5-44869. More specifically, in the HCl gas added MOCVD process, when a group III-V compound semiconductor layer is epitaxially grown on a substrate with an insulating pattern by MOCVD, HCl gas is supplied simultaneously with a source gas at a molar flow ratio of the HCl gas to a Group III gas lower than 0.3, whereby the selective growth is performed with no deposition of polycrystalline material on the insulating pattern. In place of HCl gas, $Cl_2$ gas may be supplied simultaneously with the source gas at a molar flow ratio to a Group III gas lower than 0.3. Also in this case, the same effects as described above can be obtained.

Figure 6:
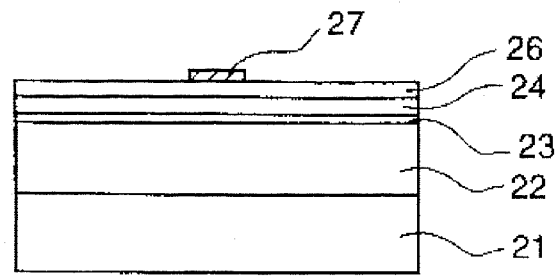
FIGS. 6(a)–6(e) are sectional views taken along a (011) plane, illustrating process steps in a method for fabricating the semiconductor laser of FIG. 5.
Figure 6:
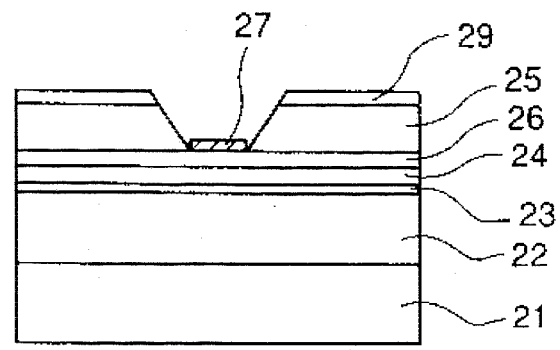
Figure 6:
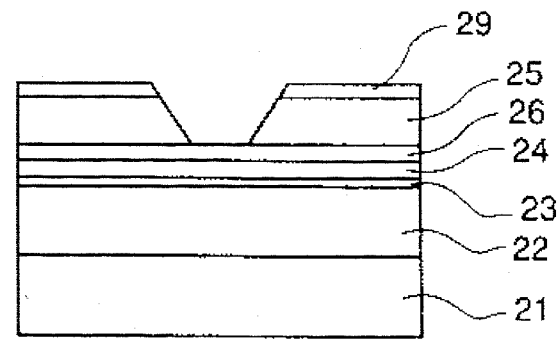
Figure 6:
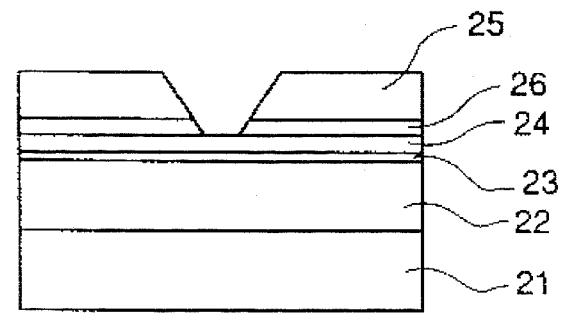
Figure 6:
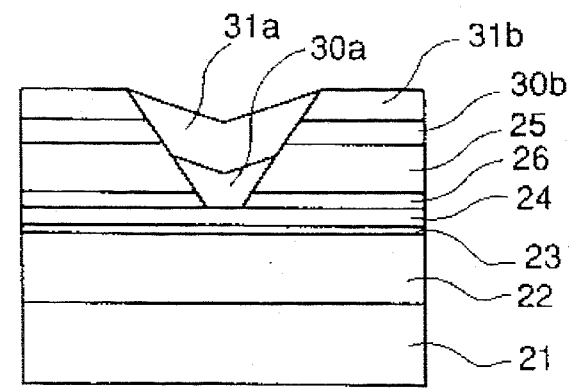

After removal of the SiN mask 27 (FIG. 6(*c*)), the first and second GaAs cap layers 26 and 29 are partially or completely removed by etching HCl gas (FIG. 6(*d*)). The same gas mixture as described in the first embodiment may be employed for the HCl gas etching. The HCl gas etching of the first and second GaAs cap layers 26 and 29 cleans the surface of the wafer in the region where the SiN mask 27 was present, whereby the quality of a crystal layer grown on that region is improved. As a result, a semiconductor laser with improved operating characteristics is realized. The wafer may be immersed in an ammonium sulfide solution before HCl gas etching.

In the step of FIG. 6(*e*), the p type AlGaAs layers 30*a* and 30*b* and the p type GaAs contact layers 31*a* and 31*b* are successively grown on the wafer. In order to improve the quality of these layers, it is desired that the HCl gas etching step shown in FIG. 6(*d*) and the growth step shown in FIG. 6(*e*) be carried out in the same chamber so that the wafer is not exposed to air. Alternatively, these steps may be carried out in different chambers with an automatic carrier system that transport the wafer in an $H_2$ ambient or an inert gas ambient between the chambers.

As described above, according to the second embodiment of the present invention, after the growth of the semiconductor multilayer structure comprising the n type cladding layer 22, the active layer 23, and the p type cladding layer 24 on the n type semiconductor substrate 21, the stripe-shaped insulating pattern 27 is formed on the semiconductor multilayer structure. Using the insulating pattern 27 as a mask for selective growth, the n type current blocking layer 25 is selectively grown on the cap layer 26 at opposite sides of the insulating pattern 27, followed by removal of the insulating pattern 27 and the growth of the p type semiconductor layers 30*a* and 30*b* and the p type contact layers 31*a* and 31*b*. Therefore, the width of the stripe-shaped active region is controlled by the width of the SiN mask 27, and the thickness of the second cladding layer 24 depends on its growth. As a result, a semiconductor laser with a narrow active region is easily fabricated with high reproducibility. When this fabrication method is applied to fabrication of a laser array, a laser array including individual laser elements with uniform characteristics is easily fabricated with high reproducibility.

Further, the semiconductor laser according to the second embodiment of the present invention includes the semiconductor multilayer structure comprising the n type cladding layer 22, the active layer 23, and the p type cladding layer 24 successively grown on the n type semiconductor substrate 21, the n type current blocking layers 25 grown on the multilayer structure and facing each other with a stripe-shaped region between, and the p type semiconductor layer 30*a* grown on that region between the current blocking layers 25. In this structure, the stripe width in the active region is controlled by the width of the SiN mask 27, and the thickness of the second cladding layer 4 depends on its growth. Therefore, the measures of the respective parts are controlled with high precision. As a result, a semiconductor laser having a stripe-shaped active region with a sufficiently narrow width and a low current threshold and emitting a laser beam with an almost circular cross-section is realized.

Embodiment 3

Figure 7:
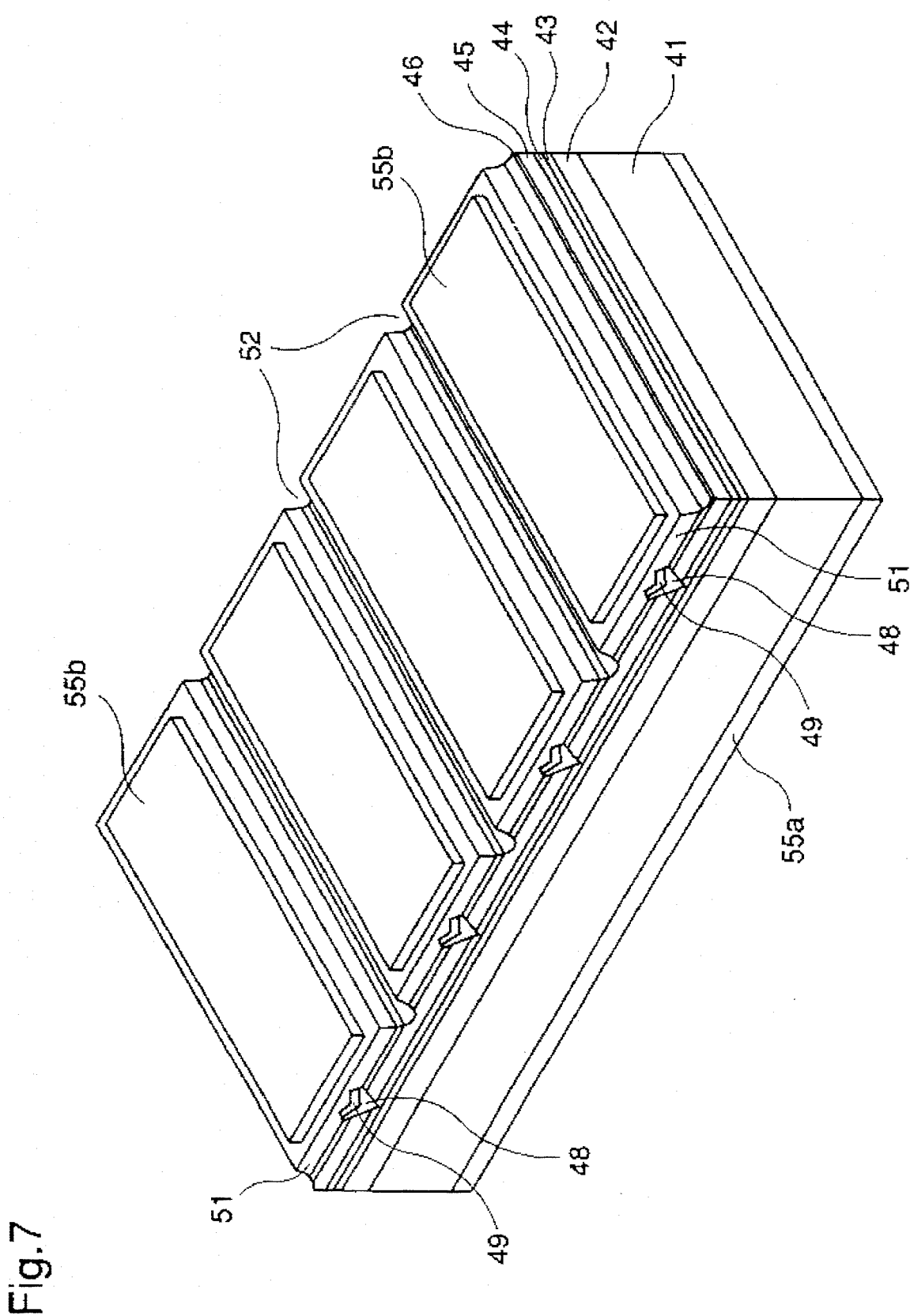
FIG. 7 is a perspective view illustrating a semiconductor laser array in accordance with a third embodiment of the present invention.

FIG. 7 is a perspective view illustrating a semiconductor laser array in accordance with a third embodiment of the present invention. In FIG. 7, four semiconductor lasers are monolithically arranged in parallel, and each laser has the same structure as the laser according to the first embodiment of the invention. More specifically, reference numeral 41 designates an n type GaAs substrate 41. An n type AlGaAs first cladding layer 42 is disposed on the GaAs substrate 41. An active layer 43 is disposed on the first cladding layer 42. A p type AlGaAs second cladding layer 44 is disposed on the active layer 43. An n type AlGaAs current blocking layer 45 is disposed on the second cladding layer 44. A first p type GaAs cap layer 46 is disposed on the current blocking layer 45. A plurality of stripe-shaped V grooves penetrate through the cap layer 46 and the current blocking layer 45 and reach into the second cladding layer 44. P type AlGaAs layers 48 are disposed in the stripe-shaped grooves, and second p type GaAs cap layers 49 are disposed on the AlGaAs layers 48. A p type GaAs contact layer 51 is disposed on the first and second cap layers 46 and 49. The wafer is separated into four individual elements by separation grooves 52 penetrating through the contact layer 51 and the first cap layer 46 and reaching into the current blocking layer 45. An n side ohmic electrode 55*a* is disposed over the rear surface of the substrate 41, and a p side ohmic electrode 55*b* is disposed on the contact layer 51 of each laser element.

In the prior art method of fabricating a laser array, since the stripe-shaped ridges are formed by wet etching having poor controllability, it is difficult to produce individual laser elements with uniform characteristics at good yield. In this third embodiment of the invention, however, since the method according to the first embodiment of the invention that provides high controllability and high reproducibility is applied to fabrication of a laser array, a laser array including laser elements with uniform characteristics is easily fabricated.

In this third embodiment of the invention, each laser element included in the laser array has the same crystal structure as the structure according to the first embodiment. However, the laser structure according to the above-described second embodiment or laser structures according to fourth to sixth embodiments described hereinafter can be applied to a laser array with the same effects as described above.

Embodiment 4

Figure 8:
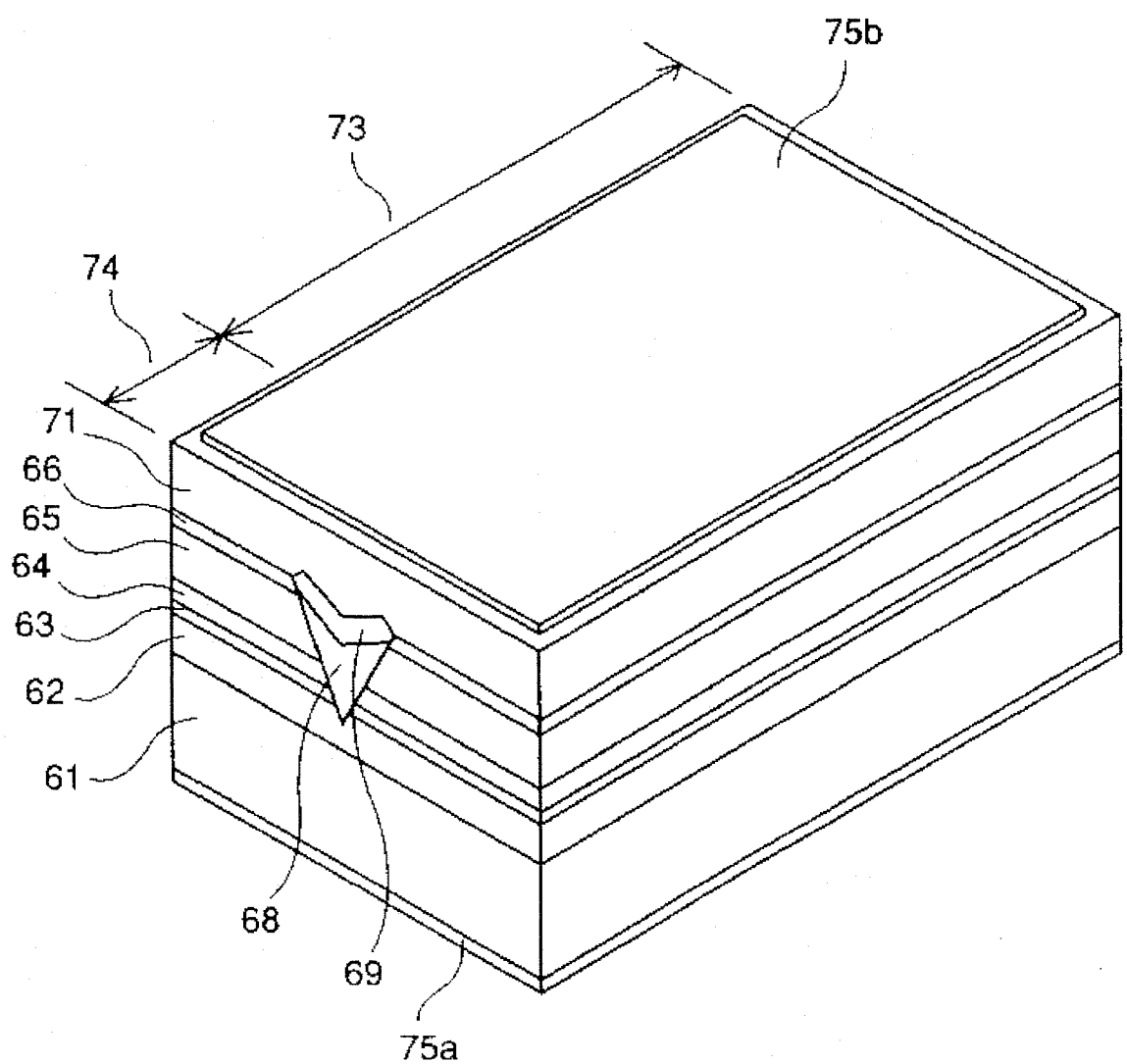
FIG. 8 is a perspective view illustrating a semiconductor laser in accordance with a fourth embodiment of the present invention.
Figure 9:
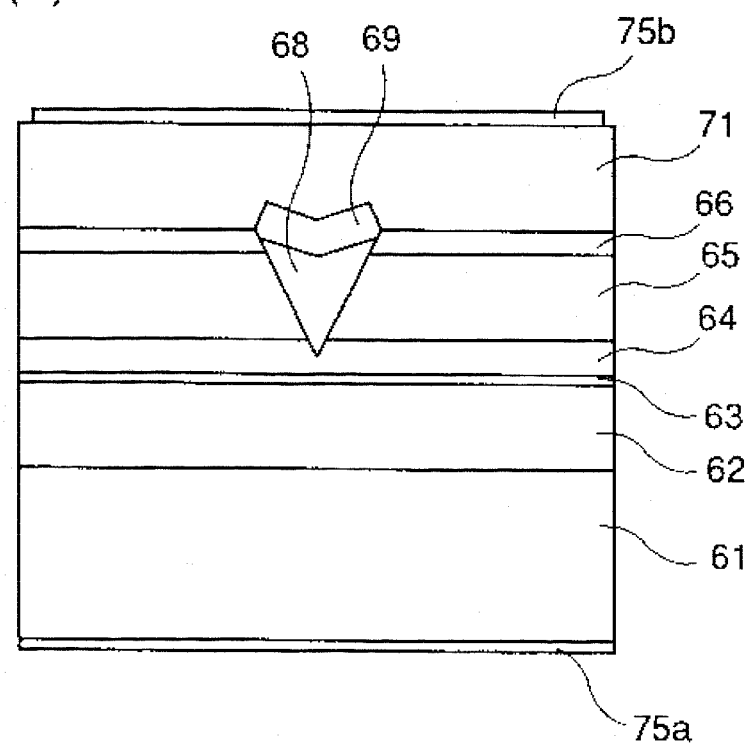
FIGS. 9(a) and 9(b) are sectional views taken along (011) planes in a laser oscillation region and a window region of the semiconductor laser shown in FIG. 8, respectively.
Figure 9:
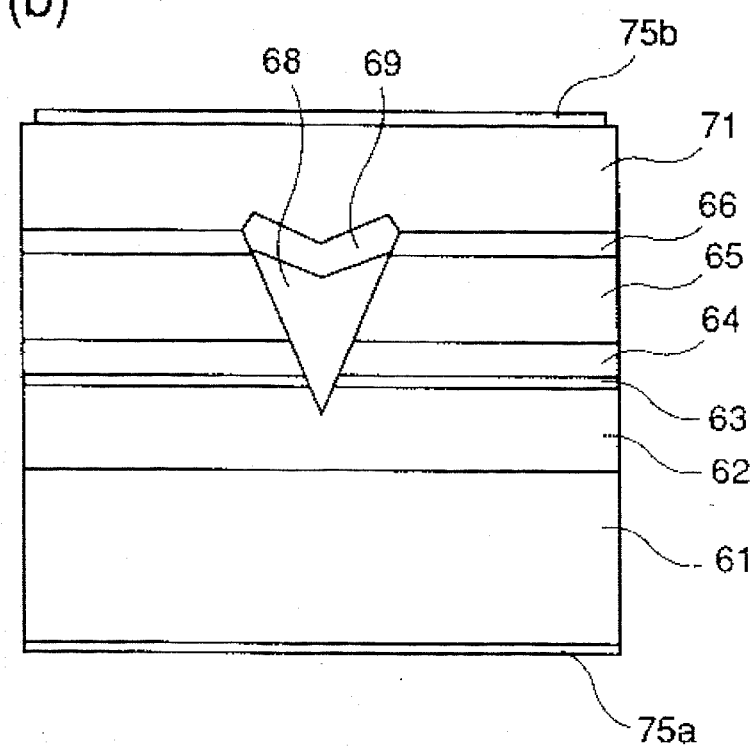

FIG. 8 is a perspective view illustrating a semiconductor laser with a window region adjacent to a laser facet in accordance with s fourth embodiment of the present invention. FIG. 9(*a*) is a sectional view of the semiconductor laser shown in FIG. 8 taken along a (011) plane in a laser oscillation region 73, and FIG. 9(*b*) is a sectional view of the semiconductor laser shown in FIG. 8 taken along a (011) plane in a window region 74.

In these figures, reference numeral 61 designates an n type GaAs substrate. An n type AlGaAs first cladding layer 62 is disposed on the GaAs substrate 61. An AlGaAs TQW-SCH active layer 63 is disposed on the first cladding layer 62. A p type AlGaAs second cladding layer 64 is disposed on the active layer 63. An n type AlGaAs current blocking layer 65 is disposed on the second cladding layer 64. A p type GaAs cap layer 66 is disposed on the current blocking layer 65. A stripe-shaped V groove penetrates through the cap layer 66, current blocking layer 65, the second cladding layer 64, and the active layer 63 and reaches into the first cladding layer 62 in the window region 74 of the structure as shown in FIG. 9(b). In the oscillation region 73, the V groove penetrates the cap layer 66 and the current blocking layer 65 and reaches into the second cladding layer 64 as shown in FIG. 9(a). A p type AlGaAs layer 68 is disposed on the V groove, and a p type GaAs cap layer 69 is disposed on the AlGaAs layer 68. A p type contact layer 71 is disposed on the cap layers 66 and 69. An n side ohmic electrode 75a is disposed on the rear surface of the substrate 61, and a p side ohmic electrode 75b is disposed on the contact layer 71.

In the semiconductor laser according to the fourth embodiment of the invention, as shown in FIGS. 9(a) and 9(b), the V groove reaches into the second cladding layer 64 in the laser oscillation region 73 like the V groove of the semiconductor laser according to the first embodiment whereas the V groove in the window region 74 penetrates through the active layer 63 and reaches into the first cladding layer 62. The V groove is filled with the p type AlGaAs layer 68 having a band gap energy larger than the band gap energy of the active layer 63.

A description is given of the fabrication process for the semiconductor laser shown in FIG. 8. The process steps for fabricating the laser structure shown in FIG. 8 are fundamentally identical to those already described with respect to FIGS. 2(a)–2(e) except that an SiN mask 67 shown in FIG. 10 in which the opening width w2 in the window region 74 is wider than the opening width w1 in the laser oscillation region 73 is used in place of the SiN mask 7 in the step of FIG. 2(a).

Figure 10:
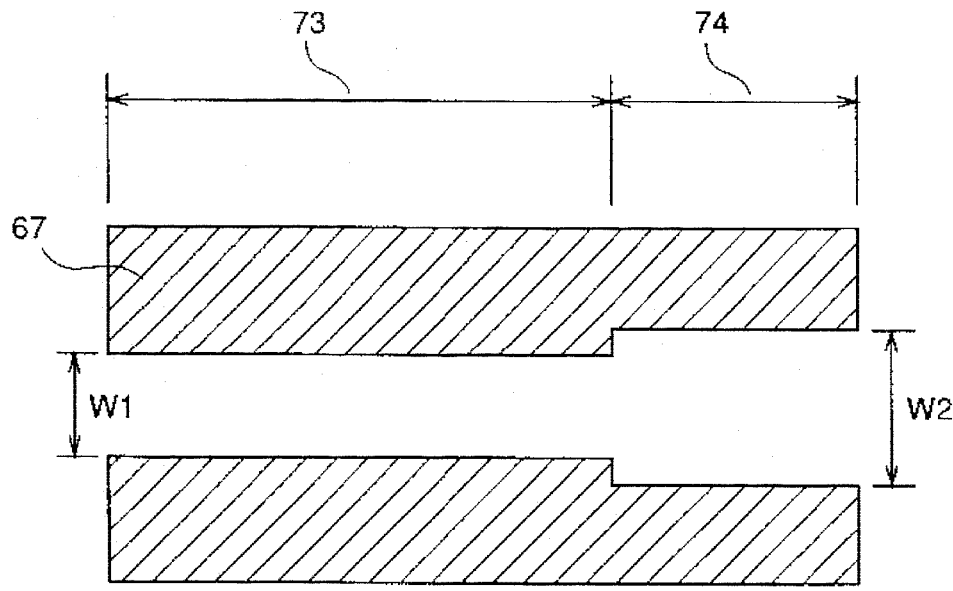
FIG. 10 is a plan view illustrating a pattern of an SiN mask used in fabrication of the semiconductor laser according to the fourth embodiment of the invention.
Figure 11:
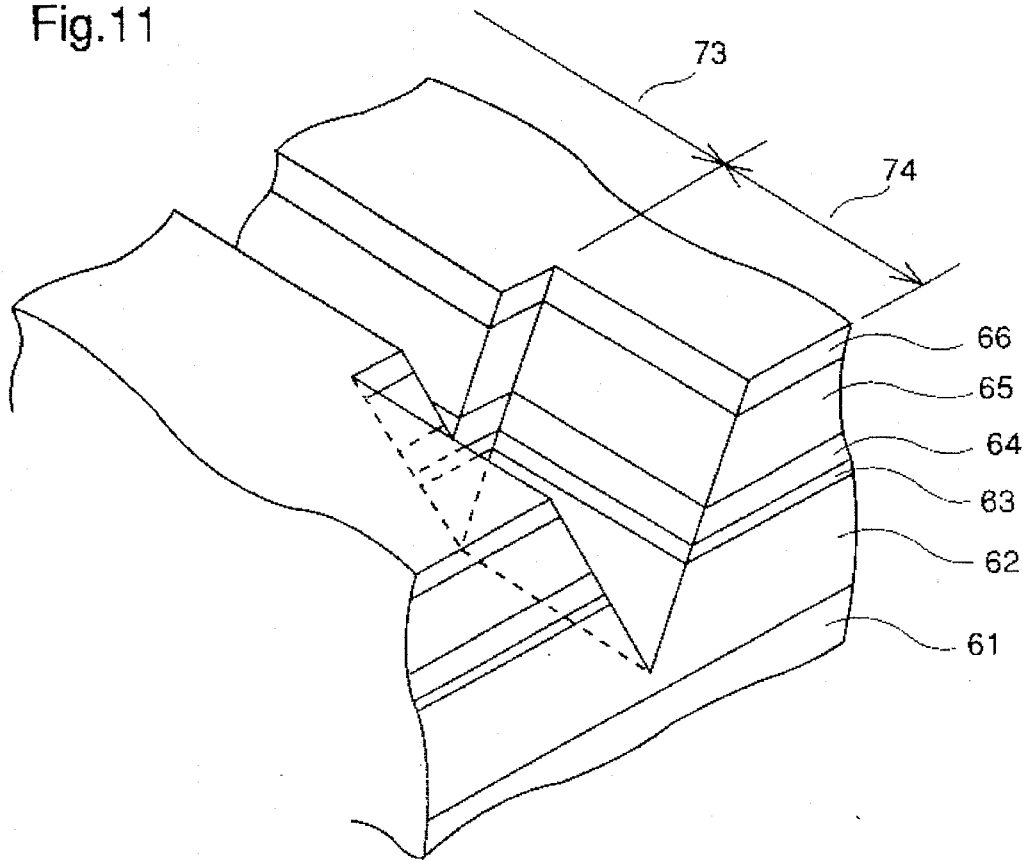
FIG. 11 is a perspective view illustrating an etching configuration obtained by HCl gas etching using the SiN mask shown in FIG. 10 as an etching mask.

FIG. 11 is a perspective view illustrating an etching configuration when the AlGaAs (GaAs) layers are subjected to HCl gas etching with the SiN pattern 67 shown in FIG. 10 as a mask. As described above, the depth of the V groove is controlled by the width of the mask pattern in HCl gas etching because the etching stops when the V groove is completed as a result of the very low etching rate in the [111]B direction. Using this characteristic, the etching depth can be partially varied as shown in FIG. 11. Therefore, in the fabrication process for the semiconductor laser according to the first embodiment of the invention, when the SiN mask 67 shown in FIG. 10 in which the opening widths w1 and w2 are appropriately selected is used as the mask 7 for selective etching and selective growth, the window structure semiconductor laser having sectional views shown in FIGS. 9(a) and 9(b) is fabricated.

Figure 12:
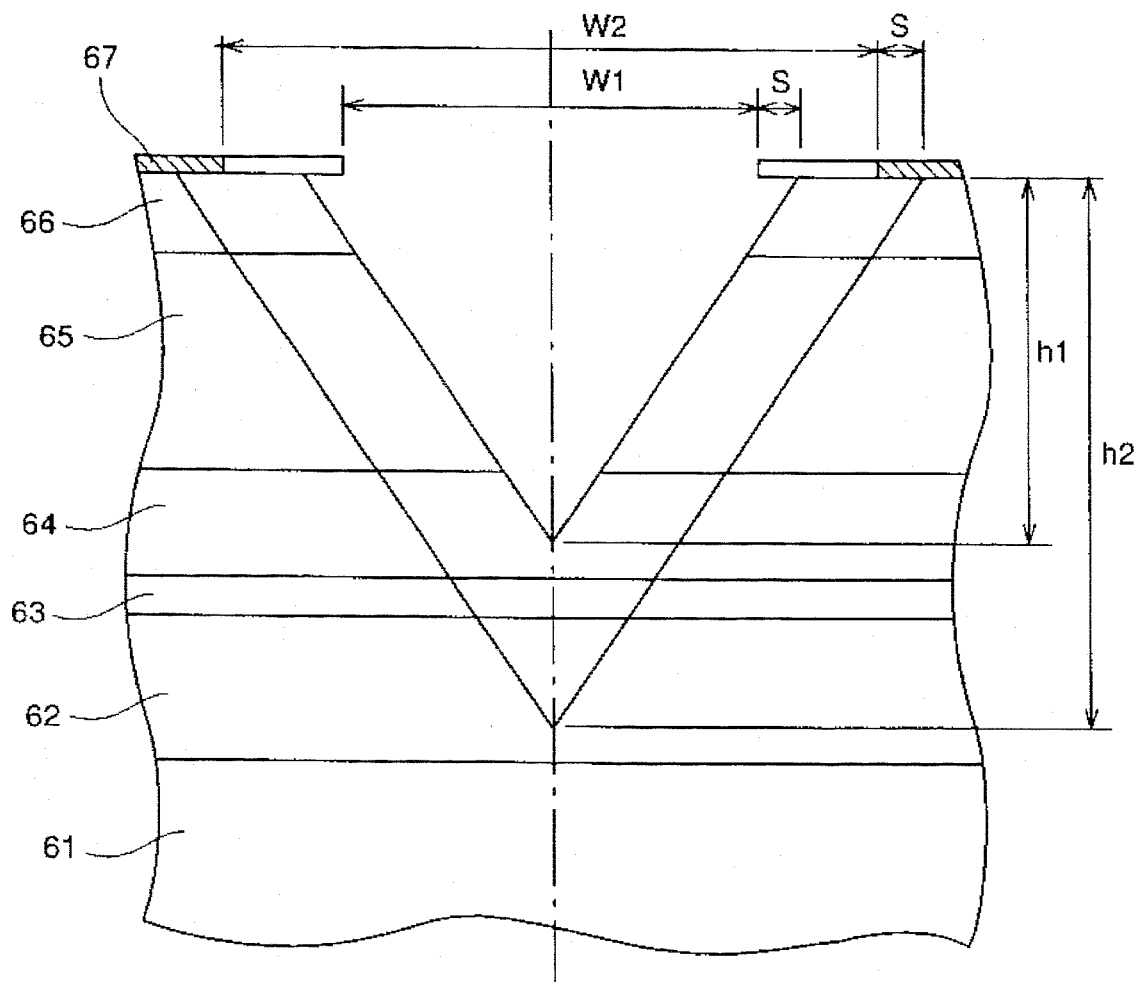
FIG. 12 is a sectional view for explaining specific measures of parts of the laser structure according to the fourth embodiment of the invention.

FIG. 12 is a schematic diagram for explaining specific examples for the opening width w1 of the SiN mask 67 in the laser oscillation region 73 and the opening width w2 of that mask in the window region 74. In the figure, the same reference numerals as in FIGS. 8 to 11 designate the same or corresponding parts. The typical thicknesses of the p type AlGaAs second cladding layer 64, the n type GaAs current blocking layer 65, and the p type GaAs cap layer 66 are 0.4 μm, 1.2 μm, and 0.6 μm, respectively. The etching depth in the laser oscillation region 73 and the etching depth in the window region 74 are denoted by h1 and h2, respectively.

When the opening width w1 is 1.97 μm, the depth h1 of the V groove in the laser oscillation region 73 is 2.1 μm, and the tip of the V groove, i.e., the etching front, stops within the p type AlGaAs second cladding layer 64. On the other hand, in the window region 74, since the V groove has to penetrate through the active layer 3, the etching depth h2 in that region must satisfy the following relation: h2>0.4+1.2+0.6+thickness of the active layer (0.2) that is, h2 must be larger than 2.4 μm. When h2 is 3 μm, the oscillation region 73 is sufficiently covered with the window region 74. That is, a 3 μm deep V groove is required in the window region 74. For this purpose, the opening width w2 in the window region 74 has to satisfy the following equation:

$$w2=(2h2/\tan 54.7°)-2S=(6/1.412)-1.0=3.25(\mu m)$$

As described above, according to the fourth embodiment of the present invention, after growing the semiconductor multilayer structure comprising the n type cladding layer 62, the active layer 63, the p type cladding layer 64, and the n type current blocking layer 65 on the n type substrate 61, the insulating film pattern 67 having a stripe-shaped opening extending in the resonator length direction is formed on the semiconductor multilayer structure so that the width of the opening in the window region 74 adjacent to the laser facet is larger than the width of the opening in the oscillation region 73. Thereafter, using the insulating film pattern 67 as a mask, the semiconductor multilayer structure is etched using HCl gas as described in the first embodiment, forming a stripe-shaped V groove having side surfaces in (111)B planes and reaching into the n type cladding layer 62 in the window region 74 and reaching into the p type cladding layer 64 in the oscillation region 73. Thereafter, the V groove is filled with the p type semiconductor layer 68 having a band gap energy larger than the band gap energy of the active layer, and the p type contact layer 71 is grown over the wafer. Therefore, a semiconductor laser having a narrow active region and a window structure adjacent to the laser emitting facet is easily fabricated with high reproducibility. When the above-described fabrication process is applied to a laser array, a laser array comprising individual laser elements with uniform characteristics is easily fabricated.

Furthermore, since HCl gas etching and MOCVD selective growth can be successively carried out in the same chamber, the interface between the oscillation region 73 and the window region 74 is never exposed to air. Therefore, surface states are not produced at the interface, resulting in a high-quality window structure.

Furthermore, the semiconductor laser according to the fourth embodiment of the invention includes the semiconductor multilayer structure grown on the n type semiconductor substrate 61 and comprising the n type cladding layer 62, the active layer 63, the p type cladding layer 64, and the n type current blocking layer 65. The stripe-shaped V groove formed in the semiconductor multilayer structure and extending in the resonator length direction reaches into the n type cladding layer 62 in the window region 74 and into the p type cladding layer 64 in the oscillation region 73. The p type semiconductor layer 68 is grown in the V groove. Therefore, a facet window structure semiconductor laser having a narrow active region and a low current threshold and emitting a laser beam with an almost circular cross-section is realized.

Figure 13:
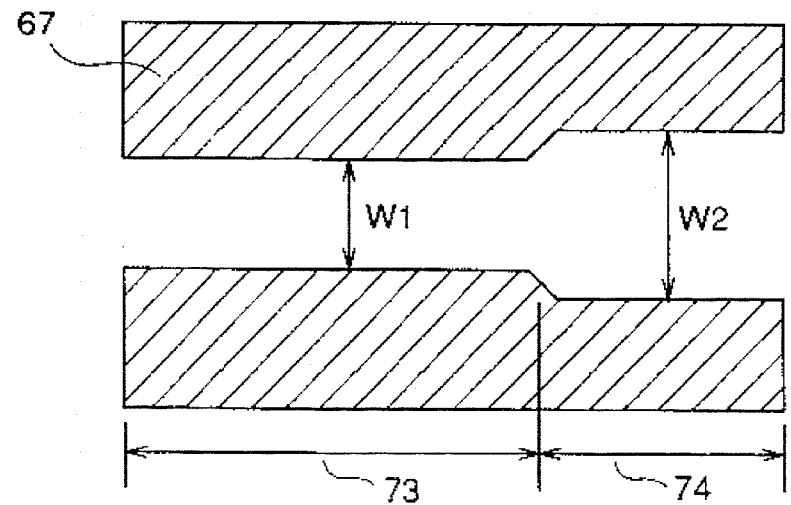
FIG. 13 is a plan view illustrating a pattern of an SiN mask used in fabrication of the semiconductor laser according to the fourth embodiment of the invention.
Figure 14:
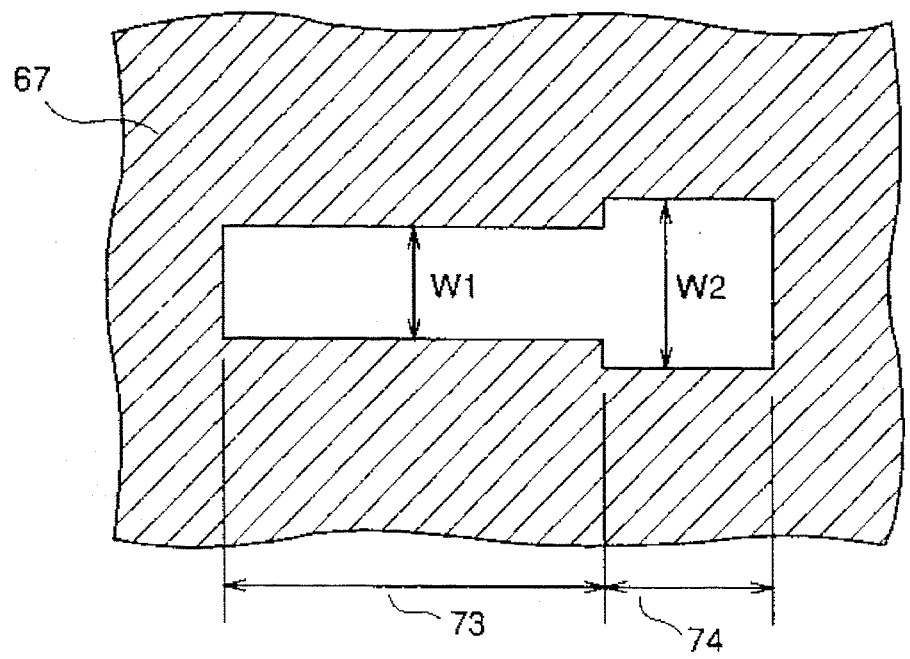
FIG. 14 is a plan view illustrating a pattern of an SiN mask used in fabrication of the semiconductor laser according to the fourth embodiment of the invention.

In this fourth embodiment of the invention, the pattern of the SiN mask 7 used for selective etching and selective growth is not restricted to the pattern shown in FIG. 10. For example, SiN mask patterns shown in FIGS. 13 and 14 also provide the same laser structure as shown in FIG. 11. That is, the laser structure shown in FIG. 11 is produced as long as the opening width w2 of the mask pattern in the window region 74 is wider than the opening width w1 in the laser oscillation region 73 so that the V groove penetrates through the active layer in the window region when it is formed by etching.

Although emphasis has been placed upon a laser structure in which a window region is adjacent to one of opposed resonator facets of the laser, a laser structure including two window regions adjacent to both resonator facets is within the scope of the invention.

Embodiment 5

Figure 15:
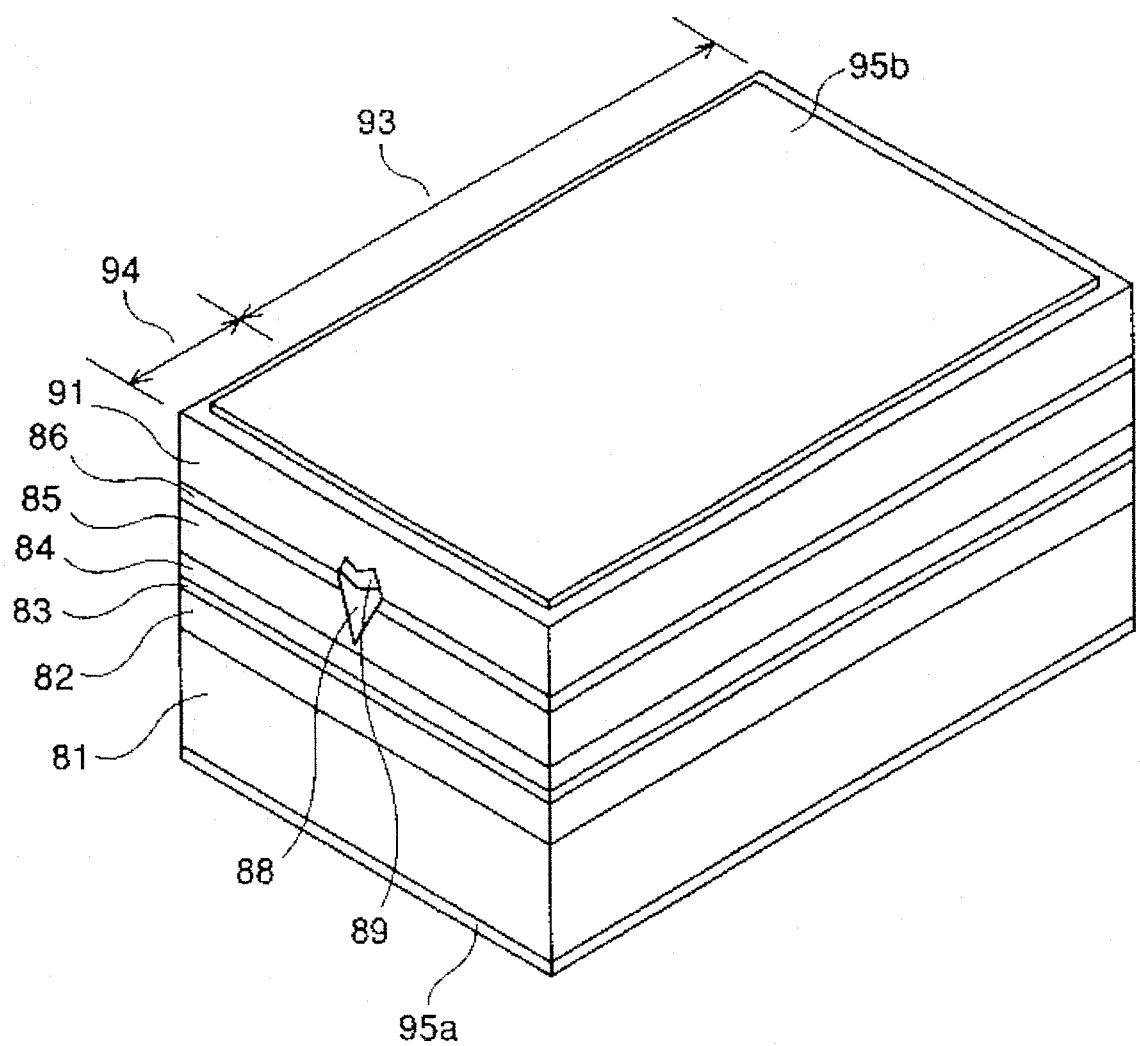
FIG. 15 is a perspective view illustrating a semiconductor laser in accordance with a fifth embodiment of the present invention.
Figure 16:
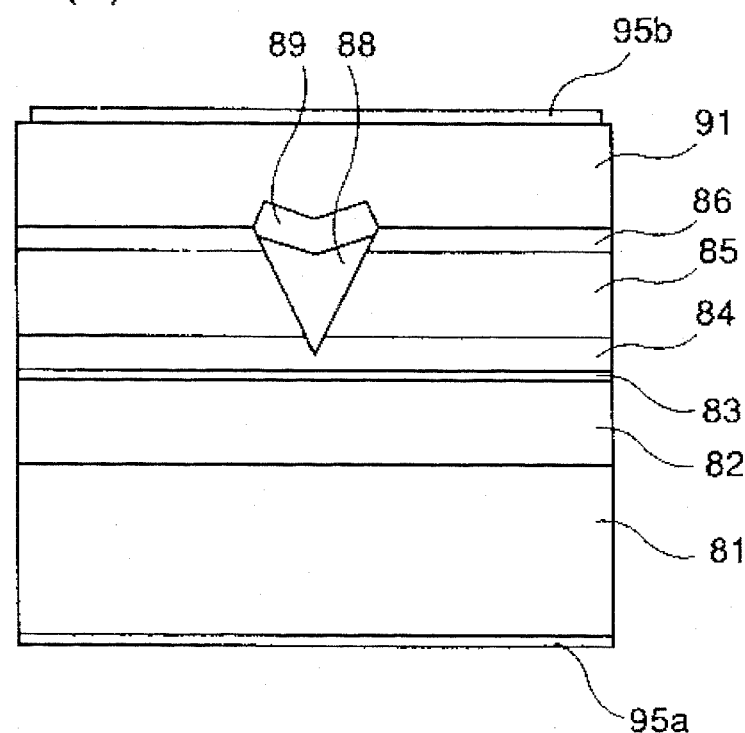
FIGS. 16(a) and 16(b) are sectional views taken along (011) planes in a laser oscillation region and a current non-injection region of the semiconductor laser shown in FIG. 15, respectively.
Figure 16:
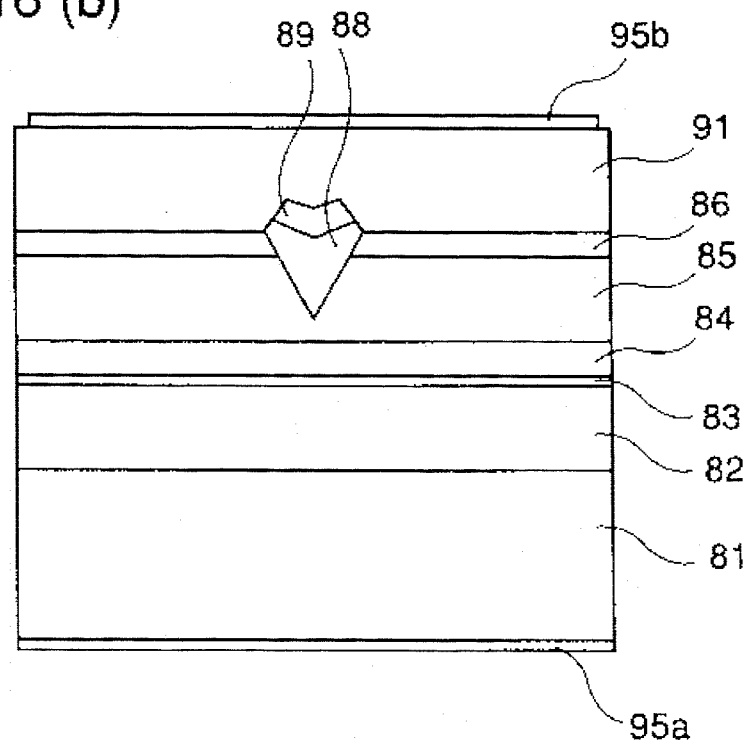

FIG. 15 is a perspective view illustrating a semiconductor laser with a current non-injection region adjacent to a laser emitting facet (hereinafter referred to as facet non-injection type laser), in accordance with a fifth embodiment of the present invention. FIG. 16(a) is a sectional view of the laser structure shown in FIG. 15 taken along a (011) plane in a laser oscillation region 93, and FIG. 16(b) is a sectional view of the laser structure taken along a (100) plane in a current non-injection region 94.

In these figures, reference numeral 81 designates an n type GaAs substrate. An n type AlGaAs first cladding layer 82 is disposed on the GaAs substrate 81. An AlGaAs TQW-SCH active layer 83 is disposed on the first cladding layer 82. A p type AlGaAs second cladding layer 84 is disposed on the active layer 83. An n type AlGaAs current blocking layer 85 is disposed on the second cladding layer 84. A p type GaAs cap layer 86 is disposed on the current blocking layer 85. A stripe-shaped V groove penetrates through the cap layer 86 and reaches into the current blocking layer 85 in the current non-injection region 94 whereas it penetrates through the cap layer 86 and the current blocking layer 85 and reaches into the second cladding layer 84 in the laser oscillation region 93. The V groove is filled with a p type AlGaAs layer 88, and a p type GaAs cap layer 89 is disposed on the AlGaAs layer 88. A p type GaAs contact layer 91 is disposed on the cap layers 86 and 89. An n side ohmic electrode 95a is disposed on the rear surface of the substrate 81 and a p side ohmic electrode 95b is disposed on the contact layer 91.

In the semiconductor laser according to this fifth embodiment, as illustrated in FIGS. 16(a) and 16(b), the stripe-shaped V groove reaches into the p type AlGaAs second cladding layer 84 in the laser oscillation region 93 whereas the groove does not reach the second cladding layer 84 in the current non-injection region 94.

Figure 17:
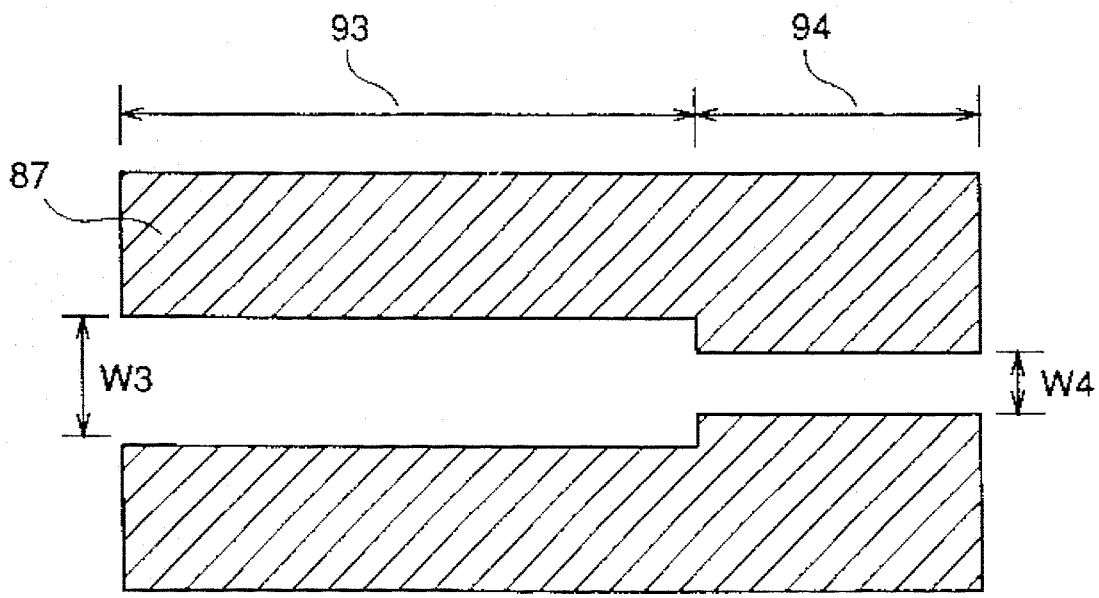
FIG. 17 is a plan view illustrating a pattern of an SiN mask used for fabrication of the semiconductor laser according to the fifth embodiment of the invention.

In fabrication of the facet non-injection type laser of this fifth embodiment, an SiN mask pattern 87 shown in FIG. 17 in which the opening width w4 in the current non-injection region 94 is narrower than the opening width w3 in the laser oscillation region 93 is employed.

The laser structure of this fifth embodiment can be fabricated in the same processing as described in the fourth embodiment. In this fifth embodiment, since the opening width of the mask is narrower in the current non-injection region 94 than in the oscillation region 93, the etching depth is shallower in the current non-injection region 94 than in the oscillation region 93. Therefore, the facet non-injection type laser shown in FIG. 15 can be fabricated by selecting the opening width in the current non-injection region 94 so that the V groove does not reach the p type AlGaAs second cladding layer 84.

As described above, according to the fifth embodiment of the present invention, after growing the semiconductor multilayer structure comprising the n type cladding layer 82, the active layer 83, the p type cladding layer 84, and the n type current blocking layer 85 on the n type substrate 81, the insulating film pattern 87 having a stripe-shaped opening extending in what becomes the resonator length direction is formed on the semiconductor multilayer structure so that the width of the opening is narrower in the current non-injection region 94 adjacent to the laser facet than in the laser oscillation region 93. Thereafter, using the insulating film pattern 87 as a mask, the semiconductor multilayer structure is etched with HCl gas as described in the first embodiment, forming a stripe-shaped V groove having side surfaces in (111)B planes and reaching into the n type current blocking layer in the current non-injection region 94 and reaching into the p type cladding layer 84 in the oscillation region 93. Thereafter, the V groove is filled with the p type semiconductor layer 88, and the p type contact layer 91 is grown over the wafer. Therefore, a semiconductor laser having a narrow stripe in the active region and a current non-injection region adjacent to the laser emitting facet is easily fabricated with one etching step. Further, the stripe-shaped V groove is produced with high controllability and reproducibility because HCl gas etching is employed. Therefore, a laser array comprising a plurality of laser elements with uniform characteristics is easily fabricated. Further, since HCl gas etching and MOCVD selective growth are carried out in the same chamber, the productivity is further improved, resulting in a high-quality facet non-injection type semiconductor laser.

The semiconductor laser according to the fifth embodiment of the present invention includes the semiconductor multilayer structure grown on the n type semiconductor substrate 81 and comprising the n type cladding layer 82, the active layer 83, the p type cladding layer 84, and the n type current blocking layer 85, the stripe-shaped V groove formed in the semiconductor multilayer structure, extending in the resonator length direction, reaching into the n type current blocking layer in the current non-injection region 94, and reaching into the p type cladding layer 64 in the oscillation region 73, and the p type semiconductor layer 88 grown in the V groove. Therefore, a facet non-injection type semiconductor laser having a narrow active region and a low current threshold and emitting a laser beam with an almost circular cross-section is realized.

Figure 18:
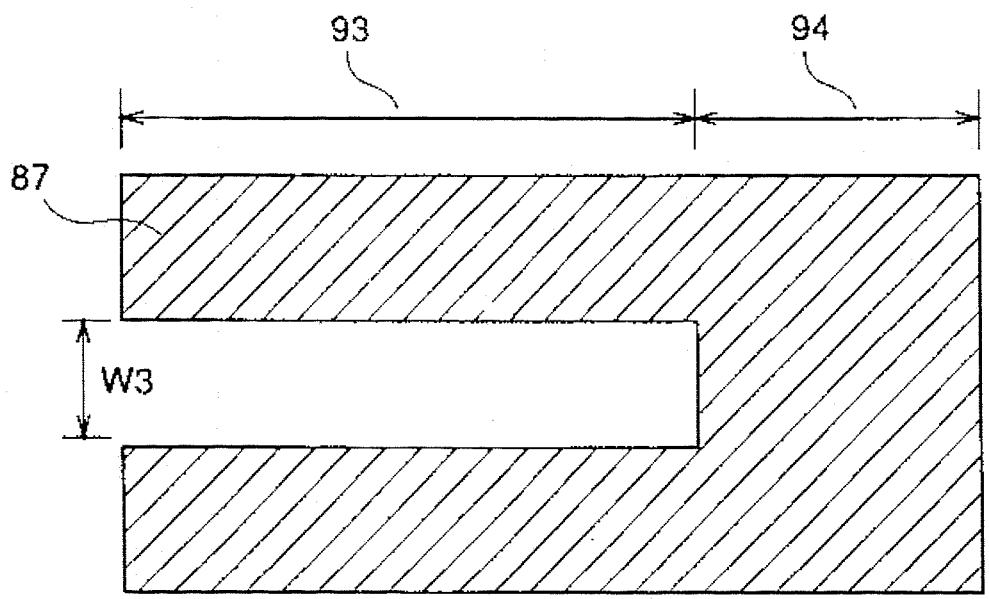
FIG. 18 is a plan view illustrating a pattern of an SiN mask used for fabrication of the semiconductor laser according to the fifth embodiment of the invention.

The SiN mask 87 may be patterned as shown in FIG. 18 so that no opening is formed in the current non-injection region 94. In this case, the V-groove is not produced in the current non-injection region 94.

Embodiment 6

Figure 19:
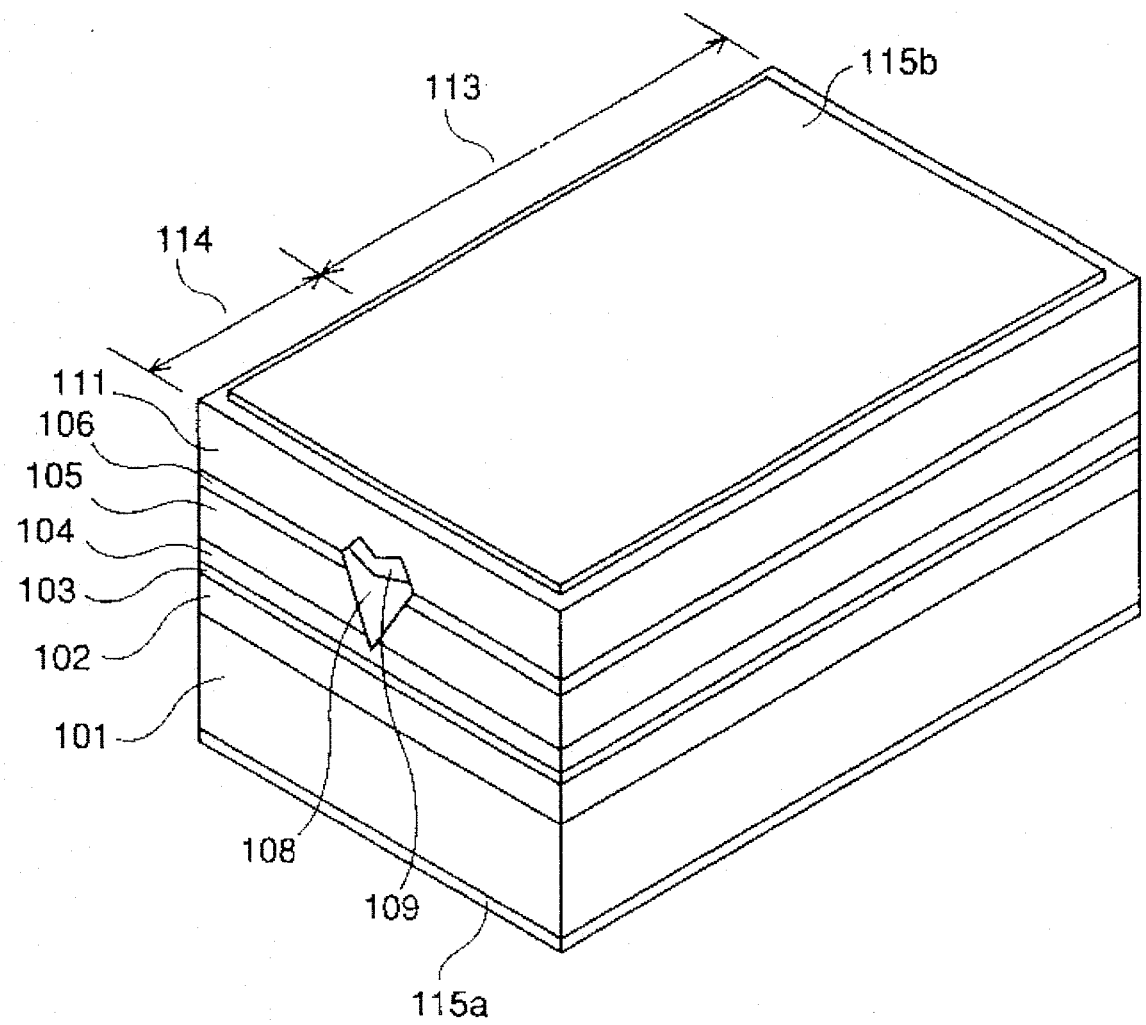
FIG. 19 is a perspective view illustrating a semiconductor laser in accordance with a sixth embodiment of the present invention.
Figure 20:
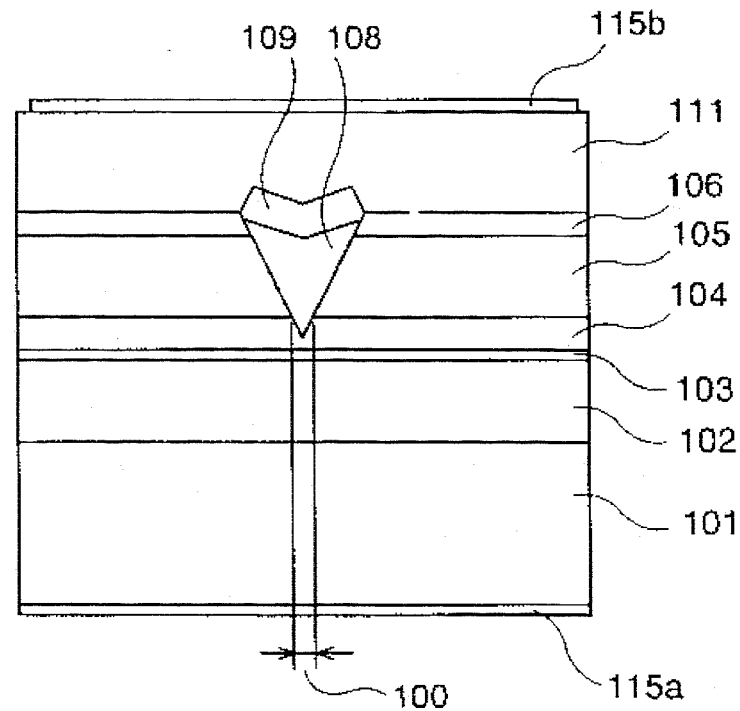
FIGS. 20(a) and 20(b) are sectional views taken along (011) planes in a laser oscillation region and a ridge width tapering region of the semiconductor laser shown in FIG. 19, respectively.
Figure 20:
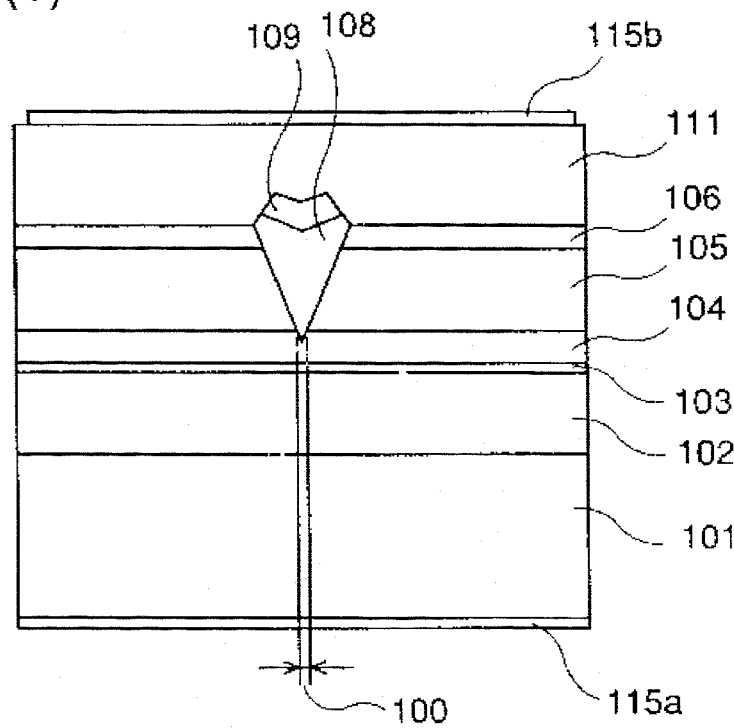

FIG. 19 is a perspective view illustrating a semiconductor laser including a stripe-shaped ridge whose width is gradually decreased toward a facet in a prescribed region adjacent to the facet, in accordance with a sixth embodiment of the present invention. FIG. 20(a) is a sectional view of the laser structure taken along a (011) plane in a laser oscillation region 113, and FIG. 20(b) is a sectional view taken along a (011) plane in a region 114 where the width of the stripe-shaped ridge gradually decreases toward the facet.

In these figures, reference numeral 101 designates an n type GaAs substrate. An n type AlGaAs first cladding layer 102 is disposed on the GaAs substrate 101. An AlGaAs TQW-SCH active layer 103 is disposed on the first cladding layer 102. A p type AlGaAs second cladding layer 104 is disposed on the active layer 103. An n type AlGaAs current blocking layer 105 is disposed on the second cladding layer 104. A p type GaAs cap layer 106 is disposed on the current blocking layer 105. A stripe-shaped V groove penetrates through the cap layer 106 and the current blocking layer 105 and reaches into the second cladding layer 104. The V groove is filled with a p type AlGaAs layer 108, and a p type GaAs cap layer 109 is disposed on the p type AlGaAs layer 108. A p type GaAs contact layer 111 is disposed on the GaAs cap layers 106 and 109. An n side ohmic electrode 115a is disposed on the rear surface of the substrate 101, and a p side ohmic electrode 115b is disposed on the contact layer 111. In FIGS. 20(a) and 20(b), reference numeral 100 designates the ridge width.

In the semiconductor laser according to this sixth embodiment of the invention, the depth of the V groove is gradually reduced in the region 114, whereby the stripe width in that region is gradually decreased toward the facet.

Figure 21:
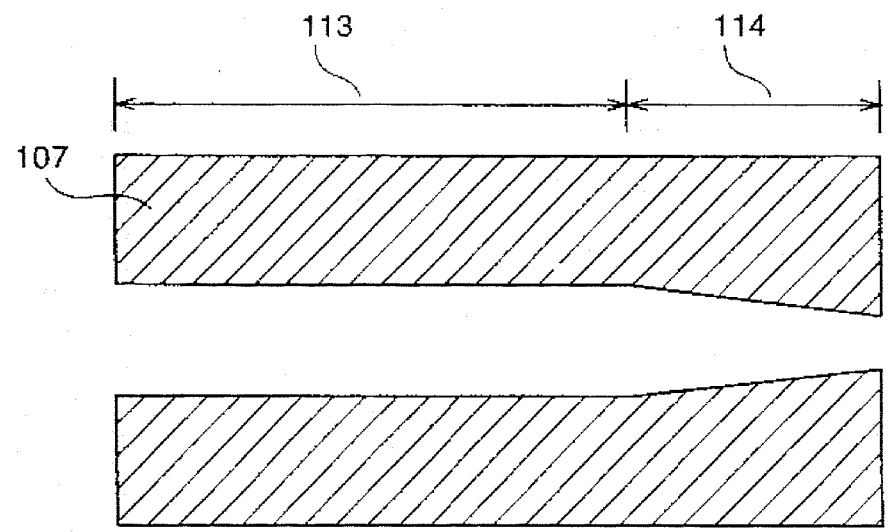
FIG. 21 is a plan view illustrating a pattern of an SiN mask used for fabrication of the semiconductor laser according to the sixth embodiment of the invention.

The laser structure shown in FIGS. 20(a)–20(b) is fabricated using an SiN mask pattern 107 shown in FIG. 21 in which the opening width is uniform in the laser oscillation region 113 but tapers toward the facet in the region 114 adjacent to the facet.

Also in this sixth embodiment, the semiconductor laser is fabricated by HCl gas etching in which the depth of the V groove is controlled by the opening width of the SiN mask, i.e., the depth of the V groove reduced with a reduction in the opening width of the SiN mask. Therefore, a semiconductor laser in which the ridge width 100 is gradually reduced toward the facet in the region 114 adjacent to the facet as shown in FIGS. 20(a)–20(b) is fabricated using the SiN mask 107 shown in FIG. 21.

The laser structure according to this sixth embodiment in which the stripe width is tapered toward the facet has the following effects.

In case of conventional loss guiding lasers, due to a difference in absorption coefficients between the waveguide and the current blocking layer as a loss-guide layer, the wave front of laser light advances in the center of the waveguide and is delayed at opposite sides in the waveguide. Thereby, the wave front in the fundamental horizontal transverse mode curves, so that a plane wave is not formed. On the other hand, with respect to the vertical transverse mode, the wave front does not curve because first and second cladding layers provide a refractive index guide structure, so that a plane wave is formed. Because of the difference in the wave front between the horizontal transverse mode and the vertical transverse mode, astigmatism occurs, whereby an image is not formed on the same plane, resulting in a fuzzy image. In conventional optical disk devices, a complicated optical system is required to correct the astigmatism and focus the image on a spot, which optical system becomes an obstacle to reduction in device size and cost.

On the other hand, in the laser structure where the ridge width is tapered toward the facet, the wave front is corrected and a plane wave is produced. However, in the prior art fabrication method in which the ridge is formed by wet etching, since wet etching has poor controllability in the direction parallel to the surface of the wafer, it is difficult to accurately control the width of the ridge. Therefore, the prior art method employing wet etching is not suitable for mass production of the lasers having tapered ridges.

In this sixth embodiment of the invention, however, since the ridge width depends on the thickness of the multilayer structure and the opening width of the SiN pattern, the tapered ridge structure is fabricated with high controllability. As a result, a laser structure with a tapered ridge is easily fabricated with high reproducibility.

As described above, according to the sixth embodiment of the present invention, after growing the semiconductor multilayer structure comprising the n type cladding layer 102, the active layer 103, the p type cladding layer 104, and the n type current blocking layer 105 on the n type substrate 101, the insulating film pattern 107 having a stripe-shaped opening extending in what becomes a resonator length direction is formed on the semiconductor multilayer structure so that the width of the stripe-shaped opening is tapered toward the facet in the region 114 adjacent to the facet while the opening width is uniform in the region 113 other than region 114. Using the insulating film pattern 107 as a mask, the semiconductor multilayer structure is etched with HCl gas in which the etching rate in the direction perpendicular to the (111)B plane is significantly lower than the etching rate in other directions, thereby forming a stripe-shaped V groove wherein the (111)B plane is exposed at the side surfaces, the tip of the V shape reaches into the p type cladding layer 104, and the distance between the tip and the active layer gradually increases toward the laser emitting facet in the region 114 adjacent to the facet. Thereafter, the V groove is filled with the p type semiconductor layer 108, and the p type contact layer 111 is grown on the wafer. Therefore, a laser structure in which the width of the active region is narrow in the active region and tapered toward the laser emitting facet is easily fabricated with high reproducibility.

Further, the semiconductor laser according to the sixth embodiment of the invention includes the semiconductor multilayer structure comprising the n type cladding layer 102, the active layer 103, the p type cladding layer 104, and the n type current blocking layer 105 grown on the n type semiconductor substrate 10, the stripe-shaped V groove extending in the resonator length direction and having a distance from the tip of the V shape to the active layer gradually increasing toward the laser emitting facet in the region 114 adjacent to the facet, and the p type semiconductor layer 108 grown in the V groove. This laser structure provides a stripe-shaped active region that is sufficiently narrow and tapered toward the facet in a region adjacent to the facet, a low threshold current, and a laser beam having an almost circular cross-section.

While in the above-described first to sixth embodiment emphasis has been placed upon a laser structure including an n type substrate, a similar structure including a p type substrate is within the scope of the invention. In this case, semiconductor layers grown on the p type substrate have opposite conductivity types from those described above.

In the above-described first to sixth embodiments, emphasis has been placed upon a fabrication method in which a substrate with a (100) oriented surface is used and a V groove having inner surfaces in (111)B planes or a selectively grown layer having side surfaces in (111)B planes is fabricated. However, a similar method in which a substrate with a {100} oriented surface that is crystallographically equivalent to the (100) surface is used and a V groove having inner surfaces in {111}B planes that is crystallographically equivalent to the (111)B plane or a selectively grown layer having side surfaces in {111}B planes is fabricated is also within the scope of the invention.

Further, while in the above-described first to sixth embodiments an active layer with a TQW-SCH structure is employed, active layers with other quantum well structures, such as a single quantum well structure, an active layer comprising a bulk crystal, or a strained active layer may be employed.

Embodiment 7

Figure 22:
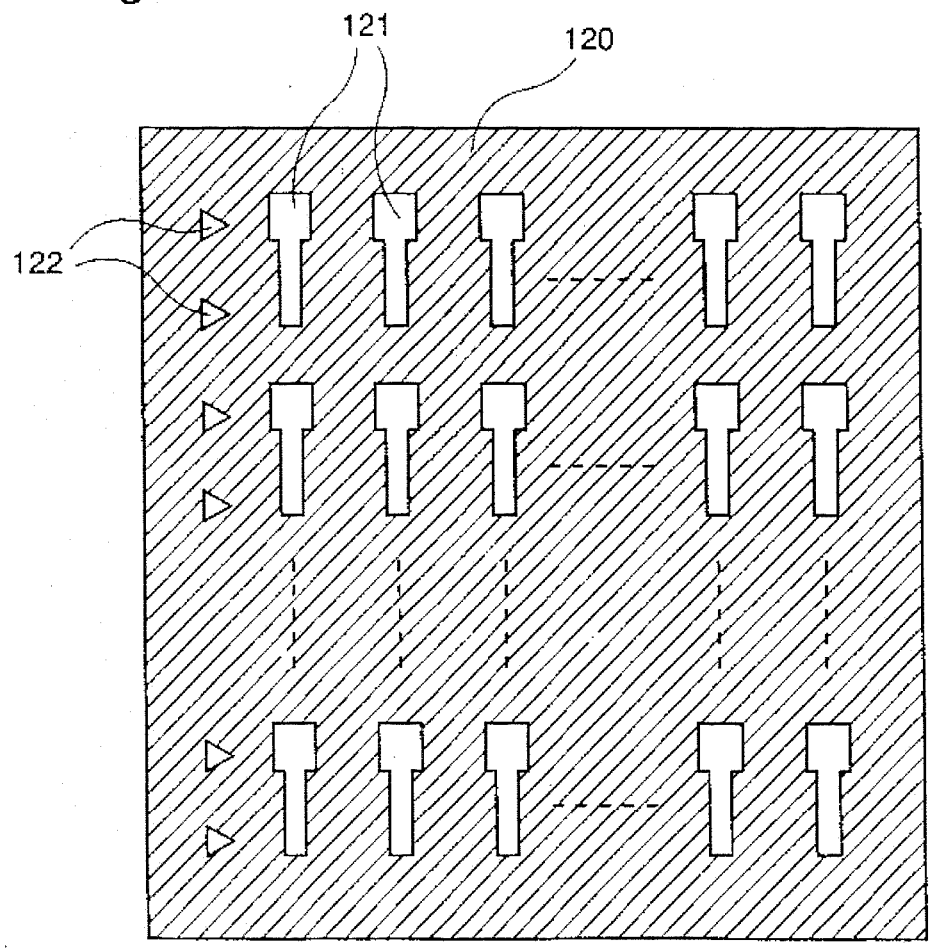
FIG. 22 is a plan view illustrating a pattern of a photomask used for fabrication of semiconductor lasers in accordance with a seventh embodiment of the invention.

FIG. 22 is a plan view illustrating a pattern of a photomask used for patterning of an SiN film in a method for fabricating semiconductor lasers in accordance with a seventh embodiment of the present invention. In the figure, reference numeral 120 designates a photomask, numeral 121 designates a pattern of stripe-shaped ridges, and numeral 122 designates a pattern of cleavage inducing grooves.

In order to fabricate a plurality of semiconductor lasers or laser arrays according to the fabrication methods described in the fourth to sixth embodiments of the invention with high controllability, cleaving positions of the respective lasers must be accurately aligned. More specifically, when the wafer is cleaved to form laser facets, means for making the thicknesses of the window regions (the current non-injection regions, the ridge tapering regions) of the individual lasers uniform is necessary.

Figure 23:
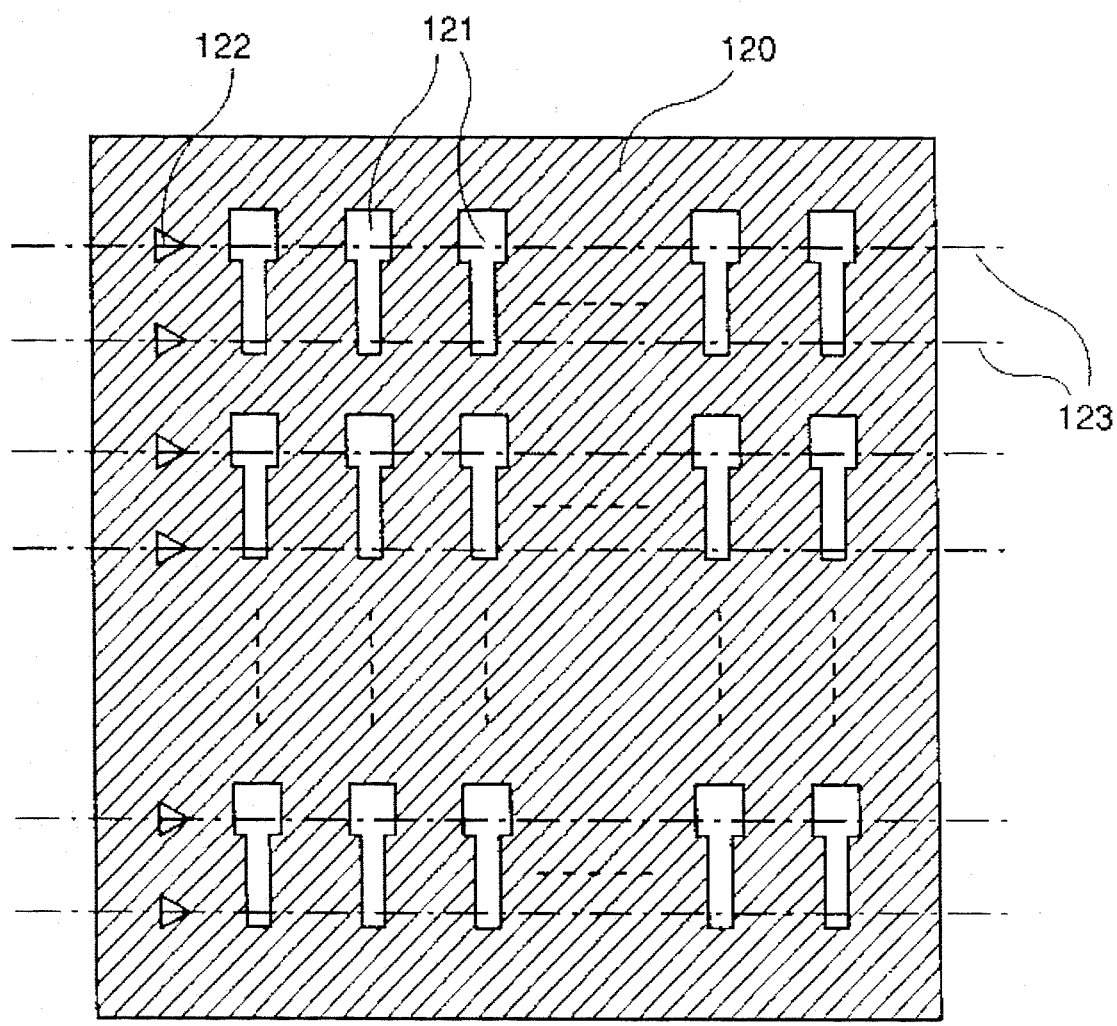
FIG. 23 is a plan view illustrating cleaving positions on the photomask shown in FIG. 22.
Figure 24:
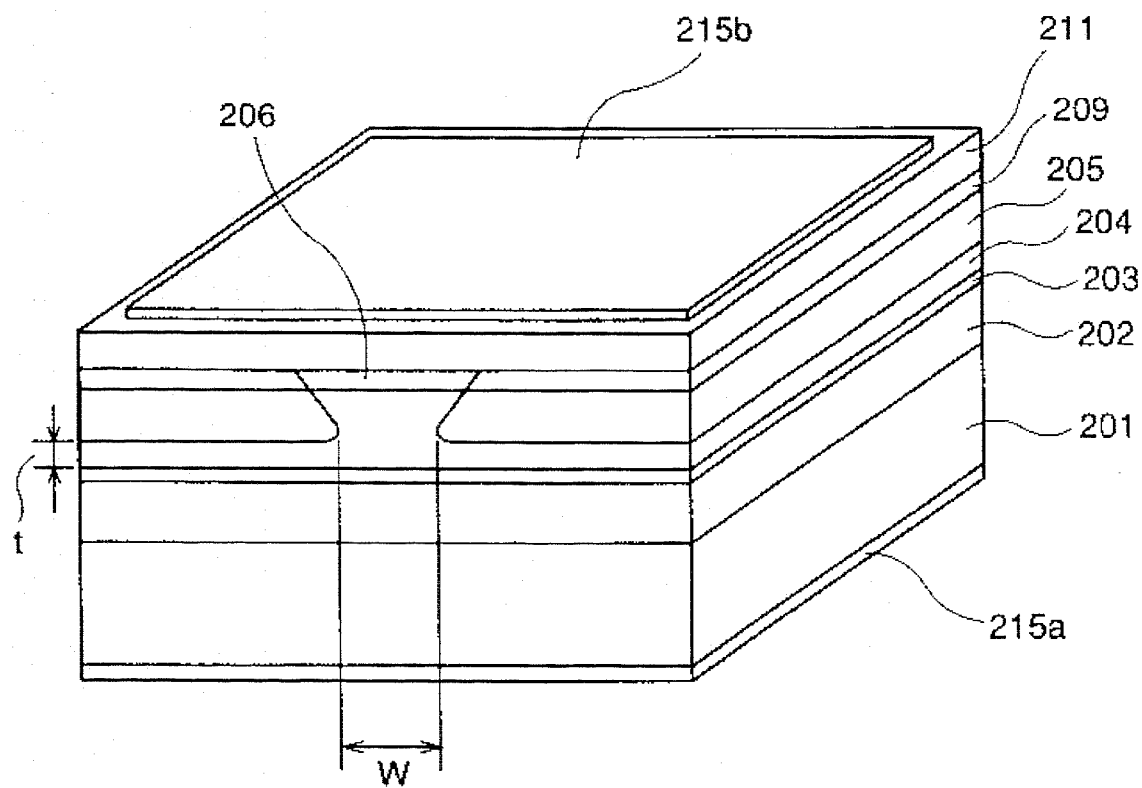
FIG. 24 is a perspective view illustrating a ridge waveguide type laser diode according to the prior art.
Figure 25:
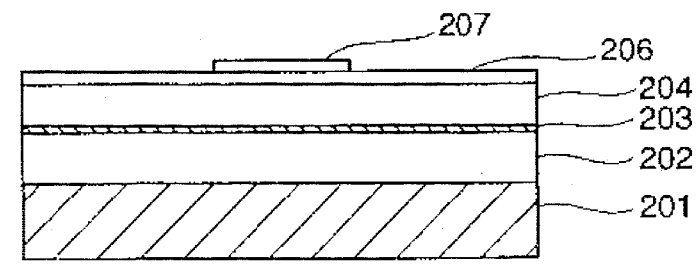
FIGS. 25(a)–25(e) are sectional views illustrating process steps in a method of fabricating the laser diode shown in FIG. 24.
Figure 25:
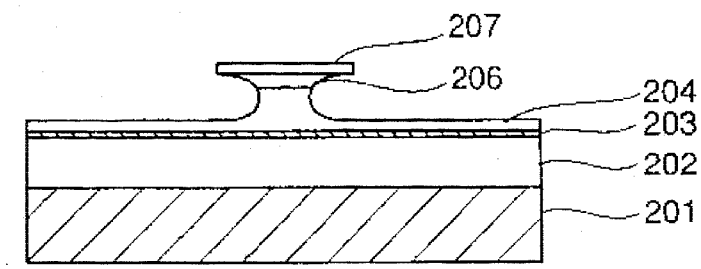
Figure 25:
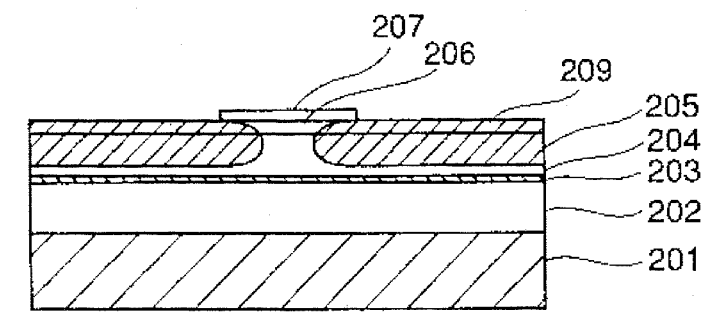
Figure 25:
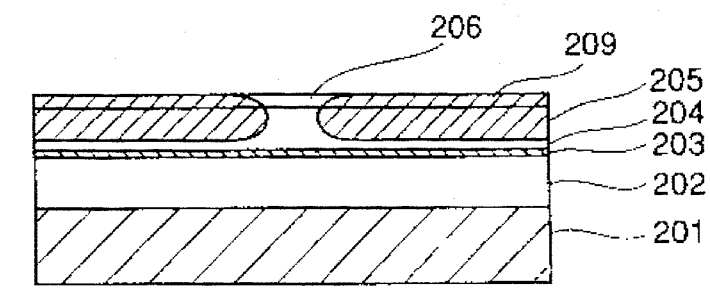
Figure 25:
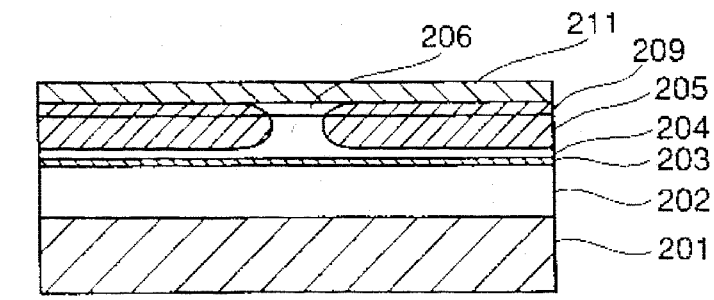
Figure 26:
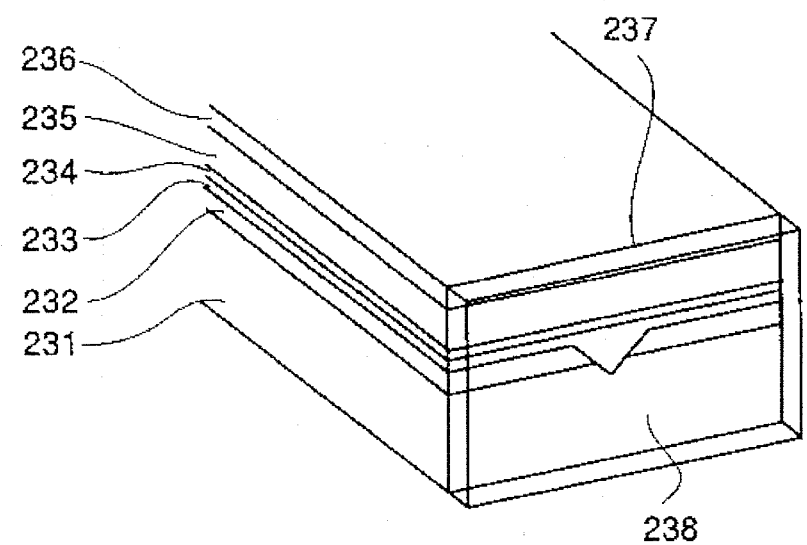
FIG. 26 is a perspective view illustrating a facet window structure laser according to the prior art.
Figure 27:
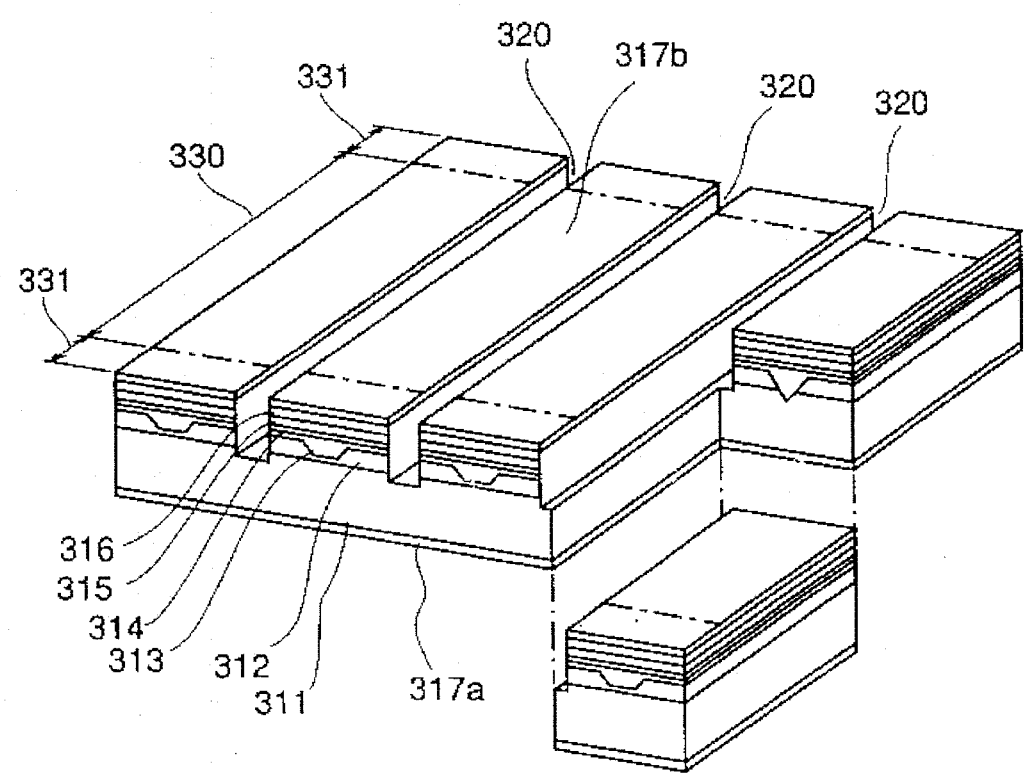
FIG. 27 is a perspective view illustrating a facet non-injection type laser according to the prior art.
Figure 28:
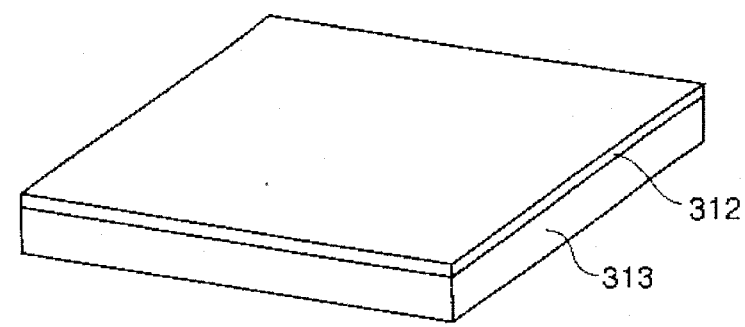
FIGS. 28(a)–28(d) are perspective views illustrating process steps in a method for fabricating the laser structure shown in FIG. 27.
Figure 28:
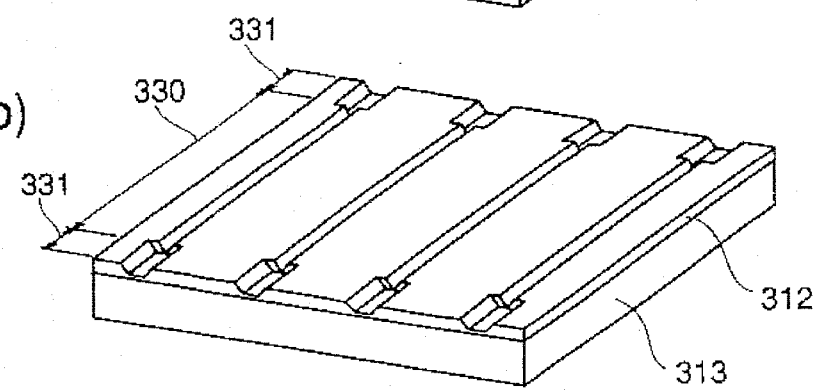
Figure 28:
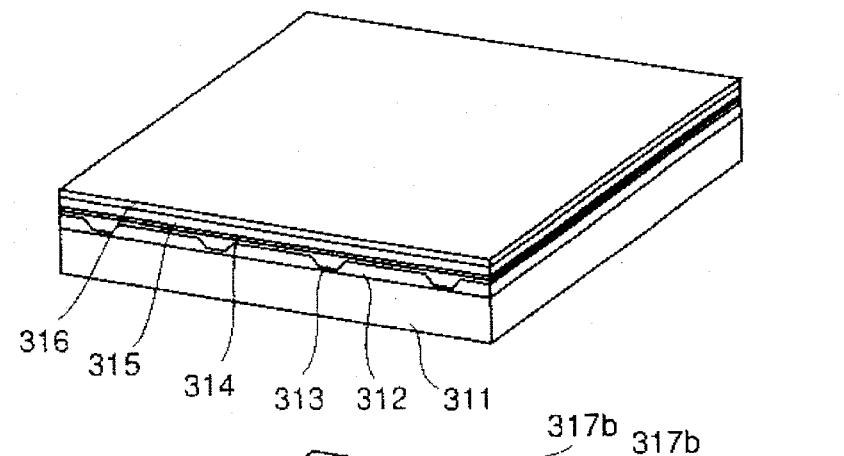
Figure 28:
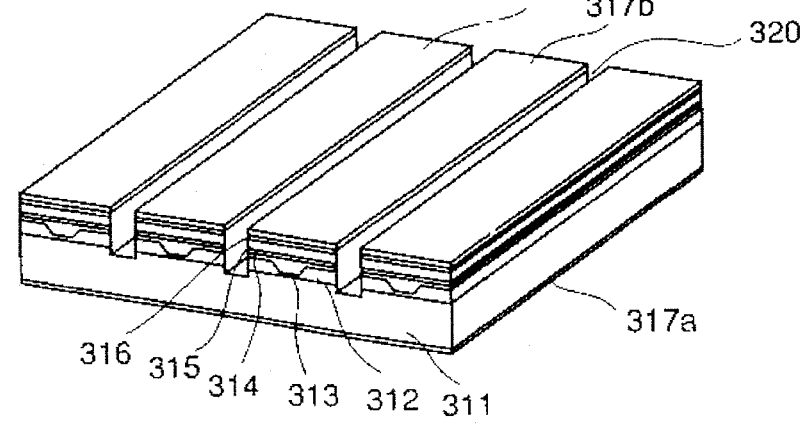

When the photomask 120 shown in FIG. 22 is used in fabrication of the above-described lasers, the cleavage inducing grooves are formed simultaneously with the V grooves, so that the cleaving positions are controlled with high accuracy. FIG. 23 is a plan view for explaining cleaving along the cleavage inducing grooves. Although the cleavage inducing grooves are filled with the regrown layer, since the cleavage inducing grooves are included in the crystal of the wafer, the controllability of the cleaving is improved. In the regrowth step, only the cleavage inducing grooves may be covered with an insulating film or the like. In this case, the insulating film is removed after the regrowth to expose the cleavage inducing groove, followed by cleaving.

As described above, according to the seventh embodiment of the present invention, since the cleavage inducing grooves are formed simultaneously with the V grooves in the fabrication process of semiconductor lasers in which alignment of cleaving positions is necessary, like the semiconductor lasers according to the fourth to sixth embodiments, those lasers are fabricated with improved controllability.

What is claimed is:

1. A semiconductor laser comprising:

a semiconductor substrate of a first conductivity type;

a semiconductor multilayer structure disposed on the substrate and comprising a first cladding layer of the first conductivity type, an active layer, a second cladding layer of a second conductivity type, opposite the first conductivity type, and a current blocking layer of the first conductivity type;

a laser light emitting facet;

a stripe-shaped V groove extending in a resonator length direction transverse to the laser light emitting facet, having a depth penetrating in a depth direction into a part of the semiconductor multilayer structure, including into the second cladding layer, and a width transverse to the resonator length direction and the depth direction, wherein at least one of the depth and width of the stripe-shaped V groove has a first dimension adjacent the laser light emitting facet and a second dimension, different from the first dimension, within the semiconductor laser spaced from the laser light emitting facet; and a semiconductor layer of the second conductivity type disposed in and filling the stripe-shaped V groove.

2. The semiconductor laser of claim 1 wherein the stripe-shaped V groove penetrates in the depth direction into the first conductivity type cladding layer adjacent to the laser light emitting facet and penetrates in the depth direction into but not through the second conductivity type cladding layer within the semiconductor laser spaced from the laser light emitting facet.

3. The semiconductor laser of claim 1 wherein the stripe-shaped V groove penetrates in the depth direction into but not through the first conductivity type current blocking layer adjacent to the laser light emitting facet and penetrates in the depth direction into but not through the second conductivity type cladding layer within the semiconductor laser spaced from the laser light emitting facet.

4. The semiconductor laser of claim 1 wherein the stripe-shaped V groove has a tip spaced from the active layer by a distance that gradually increases from within the semiconductor laser spaced from the laser light emitting facet toward the laser light emitting facet.

5. The semiconductor laser of claim 1 wherein the stripe-shaped V groove penetrates in the depth direction into but not through the second conductivity type cladding layer and has a smaller width adjacent the laser light emitting facet than within the semiconductor laser spaced from the laser light emitting facet.

* * * * *